(12) United States Patent
Wu et al.

(10) Patent No.: US 11,581,372 B2
(45) Date of Patent: Feb. 14, 2023

(54) DISPLAY SUBSTRATE HAVING STORAGE CAPACITOR WITH CAPACITOR ELECTRODE SIDES OF ONE CAPACITOR ELECTRODE BETWEEN CAPACITOR ELECTRODE SIDES OF ANOTHER CAPACITOR ELECTRODE, AND DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Zhongyuan Wu, Beijing (CN); Yongqian Li, Beijing (CN); Can Yuan, Beijing (CN); Zhidong Yuan, Beijing (CN); Dacheng Zhang, Beijing (CN); Lang Liu, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 110 days.

(21) Appl. No.: 16/977,510

(22) PCT Filed: Nov. 29, 2019

(86) PCT No.: PCT/CN2019/122179
§ 371 (c)(1),
(2) Date: Sep. 2, 2020

(87) PCT Pub. No.: WO2021/102996
PCT Pub. Date: Jun. 3, 2021

(65) Prior Publication Data
US 2021/0202604 A1 Jul. 1, 2021

(51) Int. Cl.
*H01L 29/08* (2006.01)
*H01L 27/32* (2006.01)

(52) U.S. Cl.
CPC ...... *H01L 27/3218* (2013.01); *H01L 27/3262* (2013.01); *H01L 27/3265* (2013.01); *H01L 27/3276* (2013.01)

(58) Field of Classification Search
CPC ............ H01L 27/3218; H01L 27/3262; H01L 27/3265; H01L 27/3276
(Continued)

(56) References Cited

U.S. PATENT DOCUMENTS

2012/0176299 A1   7/2012   Kang et al.
2016/0118451 A1   4/2016   Youn et al.
(Continued)

FOREIGN PATENT DOCUMENTS

CN   102779832 A   11/2012
CN   106129097 A   11/2016
(Continued)

OTHER PUBLICATIONS

Ex Parte Quayle Action from U.S. Appl. No. 16/977,512 dated Mar. 21, 2022.
(Continued)

*Primary Examiner* — Phuc T Dang
(74) *Attorney, Agent, or Firm* — Dilworth & Barrese, LLP.; Michael J. Musella, Esq.

(57) ABSTRACT

A display substrate and a display device are provided. The display substrate includes a base substrate and sub-pixels on the base substrate. At least one sub-pixel includes a storage capacitor. The storage capacitor includes a second capacitor electrode, a first capacitor electrode and a third capacitor electrode which are sequentially on the base substrate. The first capacitor electrode has a first capacitor electrode side
(Continued)

and a second capacitor electrode side opposite to each other in the second direction, and the second capacitor electrode has a third capacitor electrode side and a fourth capacitor electrode side opposite to each other in the second direction; orthographic projections of the first capacitor electrode side and the second capacitor electrode side on the base substrate are between an orthographic projection of the third capacitor electrode side and an orthographic projection of the fourth capacitor electrode side on the base substrate.

17 Claims, 18 Drawing Sheets

(58) Field of Classification Search
USPC .......................................................... 257/40
See application file for complete search history.

(56) References Cited

U.S. PATENT DOCUMENTS

| | | |
|---|---|---|
| 2016/0124279 A1 | 5/2016 | Yao et al. |
| 2016/0300898 A1 | 10/2016 | Kim |
| 2017/0053975 A1 | 2/2017 | Cho et al. |
| 2017/0069271 A1 | 3/2017 | Kim et al. |
| 2018/0061296 A1 | 3/2018 | Shim |
| 2018/0151132 A1* | 5/2018 | Lee .................. G09G 3/2018 |
| 2018/0182283 A1 | 6/2018 | Lim |
| 2018/0182302 A1 | 6/2018 | Yoo et al. |
| 2018/0183008 A1 | 6/2018 | Song et al. |
| 2018/0190198 A1 | 7/2018 | Kim |
| 2019/0108792 A1* | 4/2019 | Hwang ............. G09G 3/3258 |
| 2019/0237518 A1 | 8/2019 | Sun |
| 2020/0091193 A1 | 3/2020 | Ren et al. |
| 2020/0185360 A1* | 6/2020 | Sun .................... H01L 25/075 |
| 2020/0194461 A1* | 6/2020 | Park .................. H01L 27/124 |
| 2021/0391402 A1 | 12/2021 | Song et al. |

FOREIGN PATENT DOCUMENTS

| | | |
|---|---|---|
| CN | 109087922 A | 2/2018 |
| CN | 110164870 A | 8/2019 |
| CN | 110265412 A | 9/2019 |
| CN | 110416278 A | 11/2019 |
| EP | 2988292 A1 | 2/2016 |
| EP | 3327709 A1 | 5/2018 |

OTHER PUBLICATIONS

Ex Parte Quayle Action from U.S. Appl. No. 16/976,827 dated Feb. 2, 2022.
Ex Parte Quayle Action from U.S. Appl. No. 16/977,928 dated Jun. 25, 2021.
Extended European Search Report form European Patent Application No. 19945443.0 dated Nov. 9, 2022.
Extended European Search Report form European Patent Application No. 19945451.3 dated Oct. 5, 2022.

* cited by examiner

DISPLAY SUBSTRATE HAVING STORAGE CAPACITOR WITH CAPACITOR ELECTRODE SIDES OF ONE CAPACITOR ELECTRODE BETWEEN CAPACITOR ELECTRODE SIDES OF ANOTHER CAPACITOR ELECTRODE, AND DISPLAY DEVICE

TECHNICAL FIELD

The present disclosure relates to a display substrate and a display device.

BACKGROUND

In the field of Organic Light Emitting Diode (OLED) display, with the rapid development of high-resolution products, higher requirements are put forward on the structural design of a display substrate, such as the arrangement of pixels and signal lines.

SUMMARY

At least an embodiment of the present disclosure provides a display substrate comprising a base substrate and a plurality of sub-pixels on the base substrate. The plurality of sub-pixels are arranged in a sub-pixel array in a first direction and a second direction, the first direction intersecting with the second direction, at least one of the plurality of sub-pixels comprises a first transistor, a second transistor, a third transistor, and a storage capacitor on the base substrate, the storage capacitor comprises a first capacitor electrode, a second capacitor electrode and a third capacitor electrode, and the second capacitor electrode is electrically connected with the third capacitor electrode; a first electrode of the second transistor is electrically connected to the first capacitor electrode of the storage capacitor and a gate electrode of the first transistor, a second electrode of the second transistor is configured to receive a data signal, a gate electrode of the second transistor is configured to receive a first control signal, and the second transistor is configured to write the data signal to the gate electrode of the first transistor and the storage capacitor in response to the first control signal, a first electrode of the first transistor is electrically connected to a second capacitor electrode of the storage capacitor and configured to be electrically connected to a light emitting element, a second electrode of the first transistor is configured to receive a first power voltage, and the first transistor is configured to control a current for driving the light emitting element under control of a voltage of the gate electrode of the first transistor, a first electrode of the third transistor is electrically connected with the first electrode of the first transistor and a second capacitor electrode of the storage capacitor, a second electrode of the third transistor is configured to be connected with a detection circuit, a gate electrode of the third transistor is configured to receive a second control signal, and the third transistor is configured to detect an electrical characteristic of the sub-pixel to which the third transistor belongs by the detection circuit in response to the second control signal; the second capacitor electrode is on a side of the first capacitor electrode close to the base substrate, the third capacitor electrode is on a side of the first capacitor electrode away from the base substrate, and the first capacitor electrode is at least partially overlapped with the second capacitor electrode and the third capacitor electrode in a direction perpendicular to the base substrate; the first capacitor electrode has a first capacitor electrode side and a second capacitor electrode side opposite to each other in the second direction, and the second capacitor electrode has a third capacitor electrode side and a fourth capacitor electrode side opposite to each other in the second direction; an orthographic projection of the first capacitor electrode side on the base substrate and an orthographic projection of the second capacitor electrode side on the base substrate are between an orthographic projection of the third capacitor electrode side on the base substrate and an orthographic projection of the fourth capacitor electrode side on the base substrate.

In some examples, the third capacitor electrode has a fifth capacitor electrode side and a sixth capacitor electrode side opposite to each other in the second direction, an orthographic projection of the fifth capacitor electrode side on the base substrate and an orthographic projection of the sixth capacitor electrode side on the base substrate are between the orthographic projection of the first capacitor electrode side on the base substrate and the orthographic projection of the second capacitor electrode side on the base substrate.

In some examples, the fifth capacitor electrode side and the first capacitor electrode side are located on a same side of the sub-pixel, and the sixth capacitor electrode side and the second capacitor electrode side are located in another same side of the sub-pixel; in the first direction, the pitch W2 between the orthographic projection of the fifth capacitor electrode side on the base substrate and the projection of the first capacitor electrode side on the base substrate satisfies: $W2 \geq a2+(b2-b3)/2$, wherein $a2$ is an alignment error of the third capacitor electrode to the first capacitor electrode in the second direction, $b2$ is a difference between a design value and an actual value of the first capacitor electrode in the second direction, and $b3$ is a difference between the design value and the actual value of the third capacitor electrode in the second direction.

In some examples, the first capacitor electrode side and the third capacitor electrode side are on a same side of the sub-pixel, and the second capacitor electrode side and the fourth capacitor electrode side are on another same side of the sub-pixel; in the first direction, the pitch W1 between the orthographic projection of the first capacitor electrode side on the base substrate and the projection of the third capacitor electrode side on the base substrate satisfies: $W1 \geq a1+(b1-b2)/2$, wherein $a1$ is an alignment error of the first capacitor electrode to the second capacitor electrode in the second direction, $b1$ is a difference between a design value and an actual value of the second capacitor electrode in the second direction, and $b2$ is a difference between the design value and the actual value of the first capacitor electrode in the second direction.

In some examples, a center line of an orthographic projection of the first capacitor electrode on the base substrate in the first direction, a center line of an orthographic projection of the second capacitor electrode on the base substrate in the first direction, and a center line of an orthographic projection of the third capacitor electrode on the base substrate in the first direction coincide with one another.

In some examples, the first capacitor electrode, an active layer of the first transistor, an active layer of the second transistor, and an active layer of the third transistor are in a same layer; the first capacitor electrode and the active layer of the first transistor are in an integral structure, and the first capacitor electrode, the active layer of the second transistor, and the active layer of the third transistor are insulated from one another.

In some examples, the second capacitor electrode is on a side of the active layer of the first transistor close to the base substrate, and an orthographic projection of the active layer of the first transistor on the base substrate is covered by an orthographic projection of the second capacitor electrode on the base substrate.

In some examples, the first electrode of the first transistor, the first electrode of the third transistor, and the third capacitor electrode are one same electrode pattern.

In some examples, a first electrode of the third transistor is electrically connected to the second capacitor electrode through a first via hole, thereby electrically connecting the second capacitor electrode to the third capacitor electrode.

In some examples, the first electrode of the third transistor is further electrically connected to the active layer of the third transistor through a second via hole; in the first direction, the first via hole and the second via hole are located on a same side of the first capacitor electrode.

In some examples, the first via hole is not overlapped with the first capacitor electrode in the direction perpendicular to the base substrate.

In some examples, in the first direction, the first transistor and the second transistor are on a same side of the first capacitor electrode and on an opposite side of the first capacitor electrode to the third transistor.

In some examples, the display substrate further comprises an extension portion protruding from the gate electrode of the first transistor, and the extension portion is extended from the gate electrode of the first transistor in the second direction; the extension portion is at least partially overlapped with the first electrode of the second transistor in the direction perpendicular to the base substrate and is electrically connected with the first electrode of the second transistor.

In some examples, the active layer of the second transistor comprises a first electrode contact region, a second electrode contact region, and a channel region between the first electrode contact region and the second electrode contact region, the first electrode of the second transistor is electrically connected to the first electrode contact region, the extension portion, and the first capacitor electrode through a third via hole respectively.

In some examples, the third via hole is extended in the first direction and exposes a surface of the extension portion and at least portions of two side surfaces, which are opposite in the first direction, of the extension portion.

In some examples, a first electrode of the second transistor clads the two side surfaces of the extension portion through the first via hole.

In some examples, a gap exists between the second capacitor electrode and the first electrode of the second transistor in the first direction, the gap having a minimum size in a range of 0.5 μm to 6 μm in the first direction.

At least one embodiment of the present disclosure further provides a display device comprising the above display substrate and the light emitting element.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

Figure 1A:
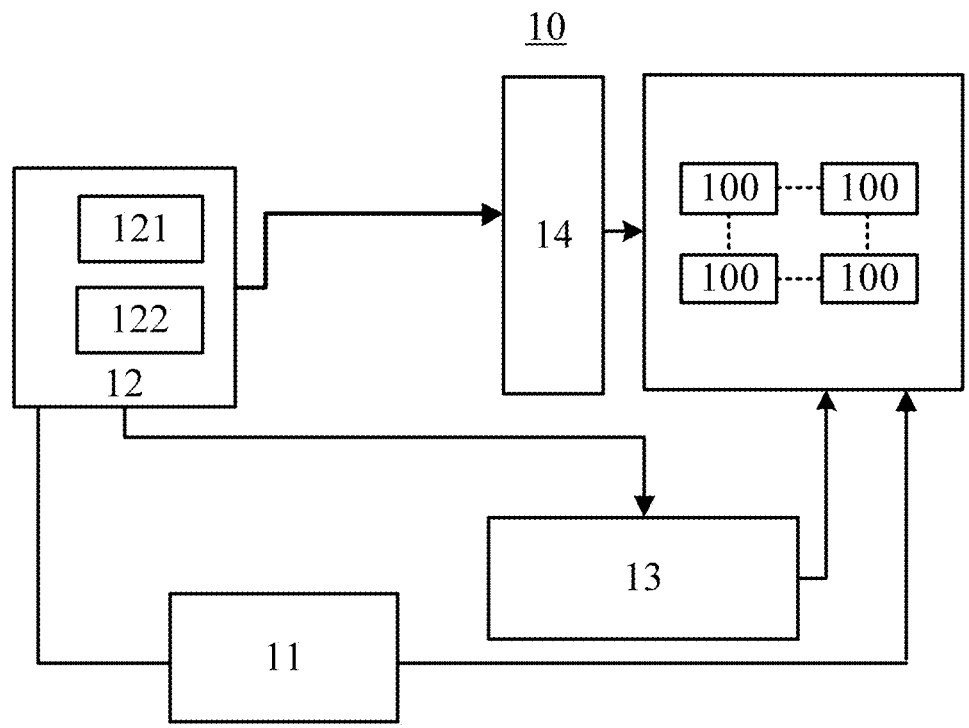
FIG. 1A is a first schematic diagram of a display substrate according to at least one embodiment of the present disclosure.

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

In the field of Organic Light Emitting Diode (OLED) display, with the rapid development of high-resolution products, higher requirements are put forward on the structural design of a display substrate, such as the arrangement of pixels and signal lines. For example, compared with an OLED display device with a resolution of 4K, due to its doubled sub-pixel units, the OLED display device with a large size and a resolution of 8K has a doubled pixel density, a decreased line width of a signal line, and an increased resistance-capacitance load and a self-resistance caused by parasitic resistance and parasitic capacitance of the signal line. Correspondingly, signal delay (RC delay), voltage drop (IR drop), voltage rise (IR rise), or the like caused by the parasitic resistance and the parasitic capacitance may become serious. These phenomena may seriously affect display quality of a display product. For example, the resistance of a power line becomes larger, so that the voltage drop on a high power voltage (VDD) line becomes larger, and the voltage rise on a low power voltage (VSS) line becomes larger, which may lead to different power voltages received by the sub-pixels at different positions, thereby causing problems, such as color shift and non-uniform display.

By connecting an auxiliary electrode line with the power line in parallel, the display substrate according to at least one embodiment of the present disclosure reduces the resistance of the power line, thereby effectively relieving the voltage drop or voltage rise on the power line and improving the display quality; meanwhile, by designing the arrangement of the auxiliary electrode line, the display substrate may reduce the problems of color shift, non-uniform display, or the like caused by the resistance-capacitance load between signal lines as much as possible.

FIG. 1A is a block diagram of a display substrate according to at least one embodiment of the present disclosure. As shown in FIG. 1A, the display substrate 10 includes a plurality of sub-pixels 100 arranged in an array, for example, each sub-pixel 100 includes a light emitting element and a pixel circuit for driving the light emitting element to emit light. For example, the display substrate is an organic light emitting diode (OLED) display substrate and the light emitting element is an OLED. The display substrate may further include a plurality of scan lines, and a plurality of data lines for providing scan signals (control signals) and data signals for the plurality of sub-pixels to drive the plurality of sub-pixels. The display substrate may further include a power line, a detection line, or the like, as necessary.

The pixel circuit includes a drive sub-circuit for driving the light emitting element to emit light and a detection sub-circuit for detecting an electrical characteristic of the sub-pixel to achieve external compensation. The specific structure of the pixel circuit is not limited in the embodiments of the present disclosure.

Figure 1B:
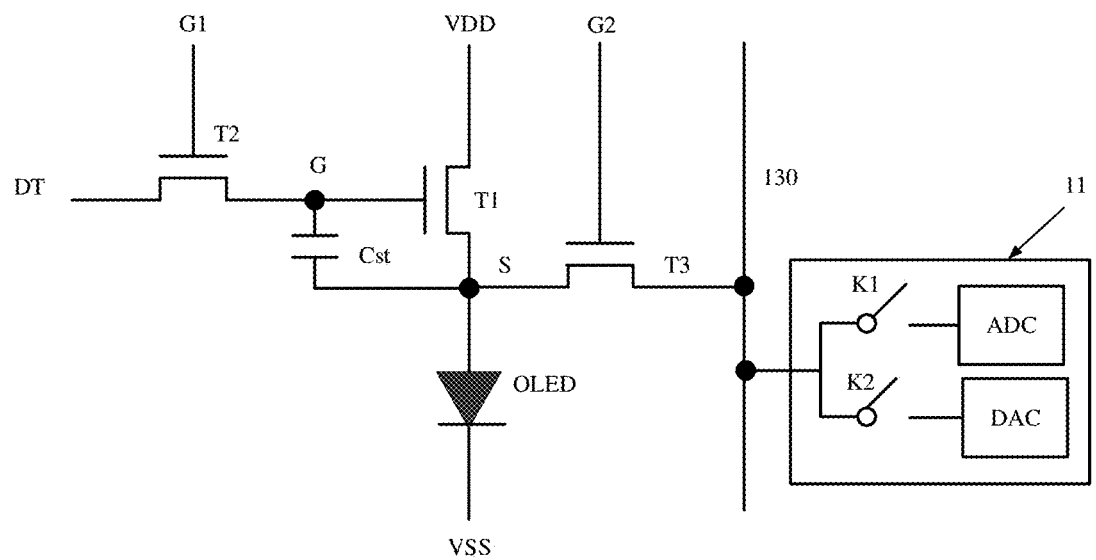
FIG. 1B is a first diagram of a pixel circuit in the display substrate according to at least one embodiment of the present disclosure.

FIG. 1B shows a schematic diagram of a 3T1C pixel circuit for the display substrate. The pixel circuit may further include a compensation circuit, a reset circuit, or the like as needed, which is not limited in the embodiments of the present disclosure.

Figure 1C:
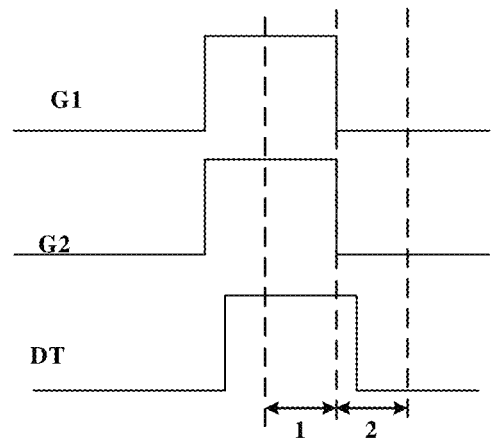
FIGS. 1C to 1E are signal timing diagrams of a driving method of a pixel circuit according to embodiments of the present disclosure.

Referring to FIGS. 1B and 1C, the pixel circuit includes a first transistor T1, a second transistor T2, a third transistor T3, and a storage capacitor Cst. A first electrode of the second transistor T2 is electrically connected to a first capacitor electrode of the storage capacitor Cst and a gate electrode of the first transistor T1, a second electrode of the second transistor T2 is configured to receive a data signal GT, and the second transistor T2 is configured to write the data signal DT to the gate electrode of the first transistor T1 and the storage capacitor Cst in response to a first control signal G1; a first electrode of the first transistor T1 is electrically connected to a second capacitor electrode of the storage capacitor Cst and is configured to be electrically connected to a first electrode of the light emitting element, a second electrode of the first transistor T1 is configured to receive a first power voltage V1 (e.g., a high power voltage VDD), and the first transistor T1 is configured to control a current for driving the light emitting element under the control of a voltage of the gate electrode of the first transistor T1; a first electrode of the third transistor T3 is electrically connected to both the first electrode of the first transistor T1 and the second capacitor electrode of the storage capacitor Cst, a second electrode of the third transistor T3 is configured to be connected to a first detection line 130 so as to be connected to an external detection circuit 11, and the third transistor T3 is configured to detect an electrical characteristic of the sub-pixel the third transistor T3 belongs to in response to the second control signal G2 to achieve external compensation; the electrical characteristic includes, for example, a threshold voltage and/or carrier mobility of the first transistor T1, or a threshold voltage and a drive current of the light emitting element, or the like. The external detection circuit 11 is, for example, a conventional circuit including a digital-to-analog converter (DAC) and an analog-to-digital converter (ADC), which are not repeated in detail in the embodiment of the present disclosure.

The transistors used in the embodiments of the present disclosure may be thin film transistors, field effect transistors, or other switching devices with the same characteristics, and the thin film transistor is taken as an example in the embodiments of the present disclosure for illustration. The source and drain of the transistor used herein may be symmetrical in structure, so that there may be no difference in structure between the source and drain. In the embodiments of the present disclosure, in order to distinguish two electrodes of the transistor except for a gate transistor, one of the electrodes is directly described as a first electrode, and the other electrode is directly described as a second electrode. Further, the transistor may be classified into N-type and P-type transistor according to their characteristics. When the transistor is a P-type transistor, a turn-on voltage is a low level voltage (e.g., 0V, −5V, −10V or other suitable voltages), and a turn-off voltage is a high level voltage (e.g., 5V, 10V or other suitable voltages); when the transistor is an N-type transistor, the turn-on voltage is a high level voltage (e.g., 5V, 10V, or other suitable voltages) and the turn-off voltage is a low level voltage (e.g., 0V, −5V, −10V, or other suitable voltages). It should be noted that, in the following description, the transistor in FIG. 1B is an N-type transistor as an example, which should not be construed as a limitation to the present disclosure.

Figure 1D:
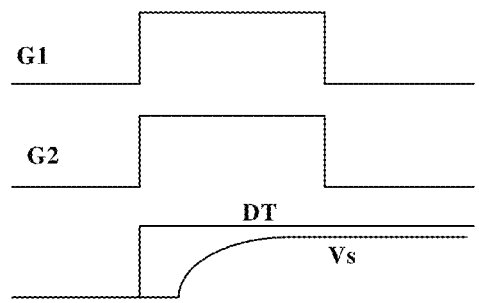
Figure 1E:
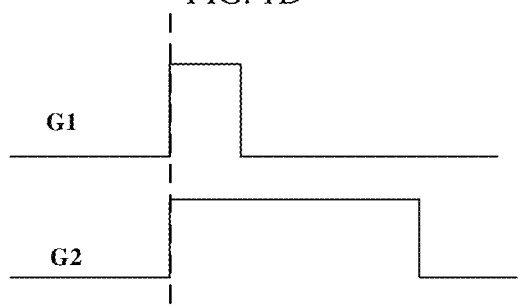

The operating principle of the pixel circuit shown in FIG. 1B will be described with reference to the signal timing diagrams shown in FIGS. 1C to 1E, wherein FIG. 1B shows the signal timing diagram of the pixel circuit during display, and FIGS. 1C and 1D show the signal timing diagram of the pixel circuit during detection.

For example, as shown in FIG. 1B, the display process of each frame image includes a data writing and resetting phase 1 and a light emitting phase 2. FIG. 1B shows a timing waveform of each signal in each phase. One operation process of the 3T1C pixel circuit includes: in the data writing and resetting phase 1, the first control signal G1 and the second control signal G2 are both turn-on signals, the second transistor T2 and the third transistor T3 are turned on, the data signal DT is transmitted to the gate electrode of the first transistor T1 through the second transistor T2, the first switch K1 is turned off, the analog-to-digital converter writes a reset signal to the first electrode of the light emitting element (e.g., an anode of the OLED) through the first detection line 130 and the third transistor T3, the first transistor T1 is turned on and generates a drive current to charge the first electrode of the light emitting element to an operating voltage; in the light emitting period 2, the first control signal G1 and the second control signal G2 are both turn-off signals, the voltage across the storage capacitor Cst remains unchanged due to a bootstrap effect of the storage capacitor Cst, the first transistor T1 operates in a saturation state with an unchanged current, and drives the light emitting element to emit light.

For example, FIG. 1C shows a signal timing diagram when the pixel circuit detects a threshold voltage. One operation process of the 3T1C pixel circuit includes: the first control signal G1 and the second control signal G2 are both turn-on signals, the second transistor T2 and the third transistor T3 are turned on, and the data signal DT is transmitted to the gate electrode of the first transistor T1 through the second transistor T2; the first switch K1 is turned off, the analog-to-digital converter writes a reset signal to the first electrode (node S) of the light emitting element through the first detection line 130 and the third transistor T3, the first transistor T1 is turned on to charge the node S until the first transistor is turned off, and the digital-to-analog converter samples the voltage on the first detection line 130 to obtain the threshold voltage of the first transistor T1. This process may be performed, for example, when the display device is turned off.

For example, FIG. 1C shows a signal timing diagram when the pixel circuit detects the mobility. One operation process of the 3T1C pixel circuit includes: in the first phase, the first control signal G1 and the second control signal G2 are both turn-on signals, the second transistor T2 and the third transistor T3 are turned on, and the data signal DT is transmitted to the gate electrode of the first transistor T1 through the second transistor T2; the first switch K1 is turned off, and the analog-to-digital converter writes a reset signal to the first electrode (node S) of the light emitting element through the first detection line 130 and the third transistor T3; in the second phase, the first control signal G1 is a turn-off signal, the second control signal G1 is a turn-on signal, the second transistor T2 is turned off, the third transistor T3 is turned on, and the first switch K1 and the second switch K2 are turned off to float the first detection line 130; due to the bootstrap effect of the storage capacitor Cst, the voltage across the storage capacitor Cst remains unchanged, the first transistor T1 operates in a saturation state with an unchanged current and drives the light emitting element to emit light, and then the digital-to-analog converter samples the voltage on the first detection line 130 and calculates the carrier mobility in the first transistor T1 according to a magnitude of the light emitting current. For example, the process may be performed in a blanking phase between display phases.

The electrical characteristics of the first transistor T1 may be obtained and a corresponding compensation algorithm may be implemented by the above-mentioned detection.

For example, as shown in FIG. 1A, the display substrate 10 may further include a data drive circuit 13 and a scan drive circuit 14. The data drive circuit 13 is configured to send out data signals, such as the above-mentioned data signal DT, as needed (for example, for inputting an image signal to the display device); the pixel circuit of each sub-pixel is further configured to receive the data signal and apply the data signal to the gate electrode of the first transistor. The scan drive circuit 14 is configured to output various scan signals, including, for example, the above-mentioned first control signal G1 and second control signal G2, which are, for example, integrated circuit chips (ICs) or gate drive circuits directly prepared on the display substrate (GOAs).

For example, the display substrate 10 further includes a control circuit 12. For example, the control circuit 12 is configured to control the data drive circuit 13 to apply the data signal, and to control the gate drive circuit to apply the scan signal. An example of the control circuit 12 is a timing control circuit (T-con). The control circuit 12 may be in various forms, for example including a processor 121 and a memory 122, the memory 121 including an executable code which the processor 121 runs to perform the above-mentioned detection method.

For example, the processor 121 may be a Central Processing Unit (CPU) or other forms of processing devices having data processing capabilities and/or instruction execution capabilities, and may include, for example, a microprocessor, a programmable logic controller (PLC), or the like.

For example, the memory 122 may include one or more computer program products which may include various forms of computer-readable storage media, such as volatile memory and/or non-volatile memory. The volatile memory may include, for example, random access memory (RAM), and/or cache memory (cache), or the like. The non-volatile memory may include, for example, read only memory (ROM), hard disk, flash memory, etc. One or more computer program instructions may be stored on the computer-readable storage medium, and the processor 121 may execute the desired functions of the program instructions. Various applications and various data, such as electrical characteristic parameters acquired in the above-mentioned detection method, etc., may also be stored in the computer-readable storage medium.

Figure 2A:
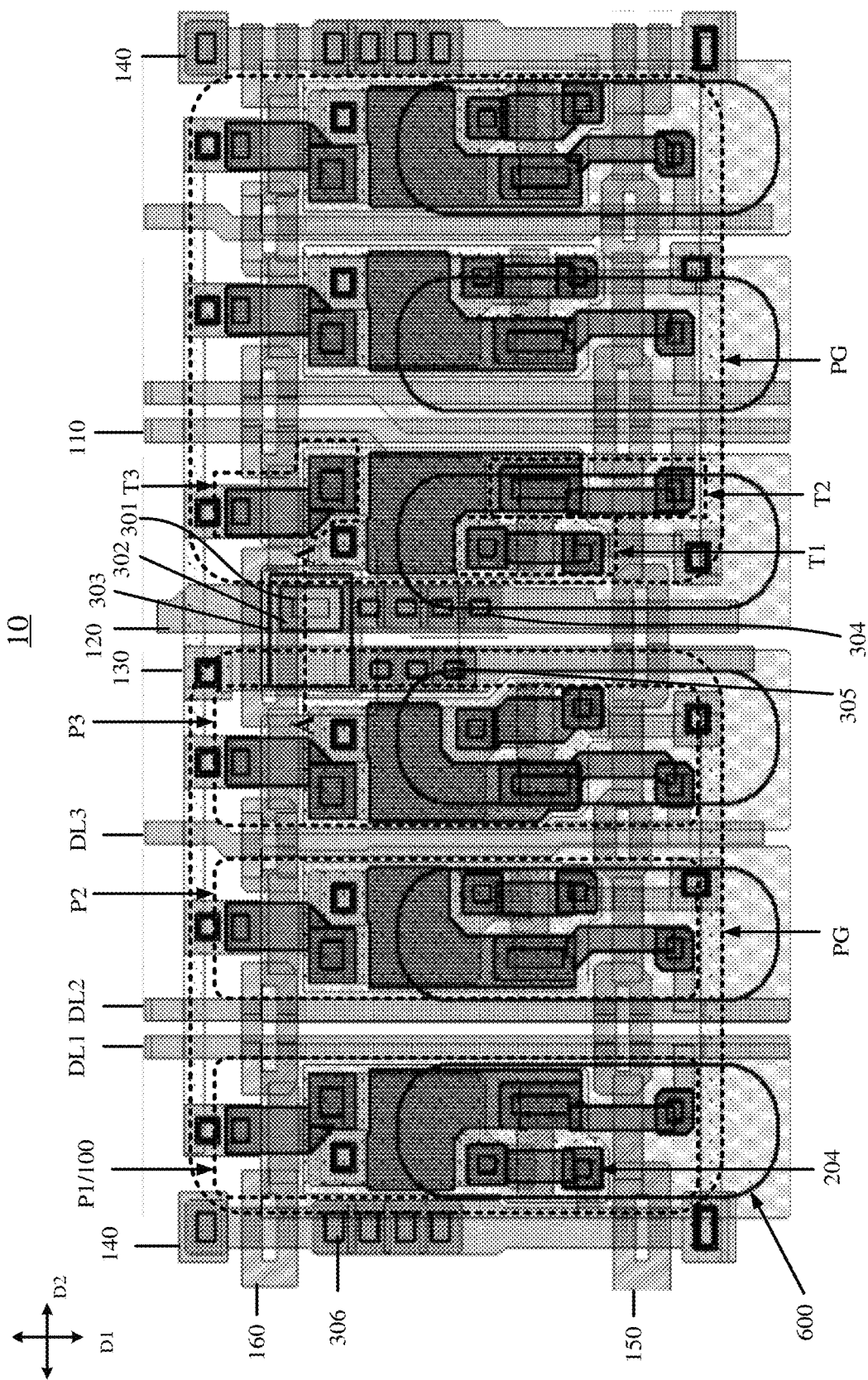
FIG. 2A is a second schematic diagram of a display substrate according to at least one embodiment of the present disclosure.

FIG. 2A is a schematic diagram of sub-pixels of a display substrate 10 according to at least one embodiment of the present disclosure, and as shown in FIG. 2A, the display substrate 10 includes a base substrate 101, and a plurality of sub-pixels 100 located on the base substrate 101. The plurality of sub-pixels 100 are arranged as a sub-pixel array having a column direction as a first direction D1 and a row direction as a second direction D2, the first direction D1 intersecting with, e.g., orthogonal to the second direction D2. Six adjacent sub-pixels in a row of sub-pixels are exemplarily shown in FIG. 2A, and the implementation of the present disclosure is not limited to this layout.

Each row of sub-pixels is divided into a plurality of sub-pixel groups PG, each sub-pixel group including a first sub-pixel P1, a second sub-pixel P2, and a third sub-pixel P3 which are sequentially arranged in the second direction. FIG. 2A only schematically shows two adjacent sub-pixel groups PG in one row of sub-pixels. For example, the first, second, and third sub-pixels P1, P2, and P3 are configured to emit light of three primary colors (RGB) respectively, so that each sub-pixel group constitutes one pixel unit. However, the number of sub-pixels included in each sub-pixel group is not limited in the embodiments of the present disclosure.

The display substrate 10 further includes a plurality of data lines 110 extended in the first direction D1, and the plurality of data lines 110 are connected to each column of sub-pixels in the sub-pixel array in one-to-one correspondence to provide data signals for the sub-pixels. The plurality of data lines are divided into a plurality of data line groups, corresponding to the plurality of sub-pixel groups PG in one-to-one correspondence.

As shown in FIG. 2A, each data line group includes a first data line DL1, a second data line DL2, and a third data line DL3 connected to the first sub-pixel P1, the second sub-pixel P2, and the third sub-pixel P3 respectively. For each sub-pixel group PG, the first data line DL1, the second data line DL2 and the third data line DL3 connected correspondingly to the sub-pixel group PG are all located between the first sub-pixel P1 and the third sub-pixel P3 in the sub-pixel group PG.

As shown in FIG. 2A, the display substrate 10 further includes a plurality of auxiliary electrode lines 120 extended in the first direction D1, the plurality of auxiliary electrode lines 120 being configured to be electrically connected with the second electrode of the light emitting element to provide a second power voltage V2, which is, for example, a low power voltage VSS. Each of the plurality of auxiliary electrode lines 120 is spaced from any one of the plurality of data lines 110 by at least one column of sub-pixels 100; that is, the auxiliary electrode line 120 is not directly adjacent to any one of the data lines 110. With such an arrangement, the signal delay on the data line caused by the resistance-capacitance load due to being directly adjacent to the auxiliary electrode line is avoided, and the problems of color shift, non-uniform display, or the like caused by the delay are further avoided.

For example, as shown in FIG. 2A, for each row of sub-pixels, the auxiliary electrode line 120 is electrically connected to the second electrode (common electrode) of the light emitting element of each sub-pixel in the row of sub-pixels through via holes, thereby forming a parallel structure with the second electrodes of the plurality of light emitting elements, and reducing the resistance for applying the second power voltage.

Figure 2B:
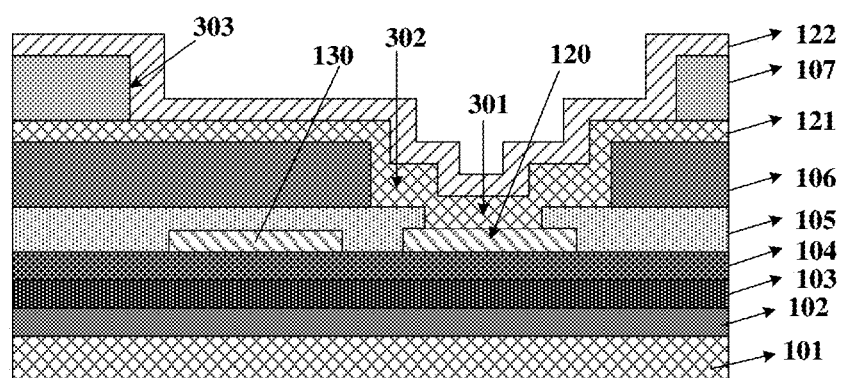
FIG. 2B is a sectional view of FIG. 2A along section line A-A'.

FIG. 2B is a sectional view of FIG. 2A along section line A-A'. With reference to FIGS. 2A and 2B, the display substrate 10 includes a first insulating layer 102, a second insulating layer 103, and a third insulating layer 104 sequentially disposed on the base substrate 101, the auxiliary electrode line 120 is located on the third insulating layer 104, for example, and the display substrate 10 further includes a fourth insulating layer 105 and a fifth insulating layer 106 disposed on the auxiliary electrode line 120.

For example, the display substrate 10 further includes a connection electrode 121 on the fifth insulating layer 106, and the auxiliary electrode line 120 is electrically connected to the connection electrode 121 through a via hole 301 in the fourth insulating layer 105 and a via hole 302 in the fifth insulating layer 106, and is connected to the second electrode 122 of the light emitting element through the connection electrode 121. For example, the auxiliary electrode line 120 is in the same layer and made of the same material as the data line in the display substrate 10, and is insulated from the data line (as shown in FIG. 6D). For example, the connection electrode 121 is provided in the same layer and made of the same material as the first electrode (not shown) of the light emitting element, and is insulated from the first electrode of the light emitting element.

The light emitting element is, for example, an organic light emitting diode, and includes the first electrode, the second electrode 122, and a light emitting layer (not shown) between the first electrode and the second electrode 122. For example, the light emitting element has a top emission structure, the first electrode is reflective and the second electrode 122 is transmissive or semi-transmissive. For example, the first electrode is made of a high work function material to act as an anode, such as an ITO/Ag/ITO stacked structure; the second electrode 122 is made of a low work function material to serve as a cathode, such as semi-transmissive metallic or metal alloy materials, such as an Ag/Mg alloy material.

For example, the auxiliary electrode line 120 is made of a metal material, such as gold (Au), silver (Ag), copper (Cu), aluminum (Al), molybdenum (Mo), magnesium (Mg), tungsten (W), or an alloy material of any combination thereof. For example, the auxiliary electrode line 120 may also be made of a conductive metal oxide material, such as Indium Tin Oxide (ITO), Indium Zinc Oxide (IZO), zinc oxide (ZnO), Aluminum Zinc Oxide (AZO), or the like.

By connecting the auxiliary electrode line 120 with the second electrode 122 in parallel, the resistance of the second electrode 122 may be reduced, thereby alleviating the problem of non-uniform display caused by the voltage rise or voltage drop on the second electrode 122.

In addition, the auxiliary electrode line 120 may be further in parallel connection with other electrodes to reduce the resistance of the auxiliary electrode line 120, thereby further reducing the resistance of the second electrode 122. For example, referring to FIGS. 2A and 6C, the auxiliary electrode line 120 is connected in parallel with the connection electrode 126 in the second conductive layer 502 through the via hole 304, and the connection electrode 126 is in the same layer and made of the same material as the scan line in the display substrate, and is insulated from the scan line.

For example, the display substrate 10 further includes a pixel defining layer 107 on the first electrode of the light emitting element. As shown in FIGS. 2A and 2B, the connection electrode 121 is connected to the second electrode 122 of the light emitting element through a via hole 303 in the pixel defining layer 107. For example, the connection electrode 121 is in the same layer as the first electrode of the light emitting element but is insulated from the first electrode of the light emitting element.

As shown in FIGS. 2A and 2B, by providing the connection electrode 121 to electrically connect the second electrode 122 of the light emitting element with the auxiliary electrode line 120, an overlarge segment difference resulting from the second electrode 122 being directly connected to the auxiliary electrode line 120 through a via hole may be avoided, and thus, a wire fracture easily caused by the huge segment difference may be avoided, and correspondingly, problems such as poor contact caused by the wire fracture may be avoided. In addition, an orthographic projection of the via hole 302 in the fifth insulating layer 106 on the base substrate 101 covers an orthographic projection of the via hole 301 in the fourth insulating layer 105 on the base substrate 101, so that a step is formed between the via hole 302 and the via hole 301, and the problem of poor contact caused by fracture of the connection electrode 121 due to the overlarge segment difference may be further avoided.

In addition, as shown in FIGS. 2A and 2B, an orthogonal projection of the via hole 303 in the pixel defining layer 107 on the base substrate 101 covers an orthogonal projection of the via hole 302 in the fifth insulating layer 106 on the base substrate 101, so that a step is formed between the via hole 303 and the via hole 302, and the second electrode 122 may be prevented from being broken due to a huge segment difference in the via hole 303, thereby avoiding problems such as poor contact caused by electrode breakage.

For example, the first insulating layer 102, the second insulating layer 103, the third insulating layer 104, and the fourth insulating layer 105 are inorganic insulating layers, for example, oxides of silicon, nitrides of silicon or oxynitride of silicon, such as silicon oxide, silicon nitride, silicon oxynitride, or an insulating material including a metal oxynitride, such as aluminum oxide, titanium nitride, or the like. For example, the fifth insulating layer 106 and the pixel defining layer 107 are made of organic insulating materials respectively, such as Polyimide (PI), acrylate, epoxy, polymethyl methacrylate (PMMA), or the like. For example, the fifth insulating layer 106 is a planarization layer.

For example, the light emitting element of the display substrate 10 according to some embodiments of the present disclosure may employ a top emission structure. For example, the pixel defining layer 107 has an opening region corresponding to each sub-pixel, the opening region corresponding to a position where the light emitting layer material of the light emitting element is formed. In FIG. 2A, the opening region 600 of the pixel defining layer 107 corresponding to each sub-pixel is shown by a thick-line rounded rectangle. For example, the opening region 600 exposes the first electrode of the light emitting element, so that the light emitting material may be formed on the first electrode. For example, the shapes and sizes of the plurality of opening regions 600 corresponding to the plurality of sub-pixels are all the same, so that the printing efficiency in manufacturing the display substrate 10 may be improved. Alternatively, the shapes and sizes of the plurality of opening regions 600 corresponding to the plurality of sub-pixels may be changed according to the light emission efficiency, the service life, or the like of the light emitting materials emitting light of different colors, for example, a printing area (opening region) of the light emitting material having a short light emission life may be set to be large, thereby improving the stability of light emission. For example, the size of the opening region 600 of the green sub-pixel, the red sub-pixel, and the blue sub-pixel may be reduced successively.

For example, as shown in FIG. 2A, the display substrate 10 further includes a plurality of first detection lines 130 extended in the first direction D1, the first detection lines 130 being configured to be connected to a detection sub-circuit (e.g., the third transistor T3) in the sub-pixel 100 and to connect the detection sub-circuit to an external detection circuit. For example, each first detection line 130 is spaced from any one of the plurality of data lines 110 by at least one column of the sub-pixels; that is, the first detection line 130 is not directly adjacent to any data line 110. By such an arrangement, the signal delay on the data line caused by the resistance-capacitance load of the data line due to the direct adjacency of the data line and the first detection line is avoided, and the problems of non-uniform display or the like caused by the delay are further avoided. In addition, since the signal transmitted on the data line 110 is usually a high frequency signal, the first detection line 130 is provided not to be directly adjacent to the data line 110, which may prevent sampling precision from being influenced by crosstalk of the high frequency signal on the first detection line 130 during the external compensation charging sampling process.

Figure 3:
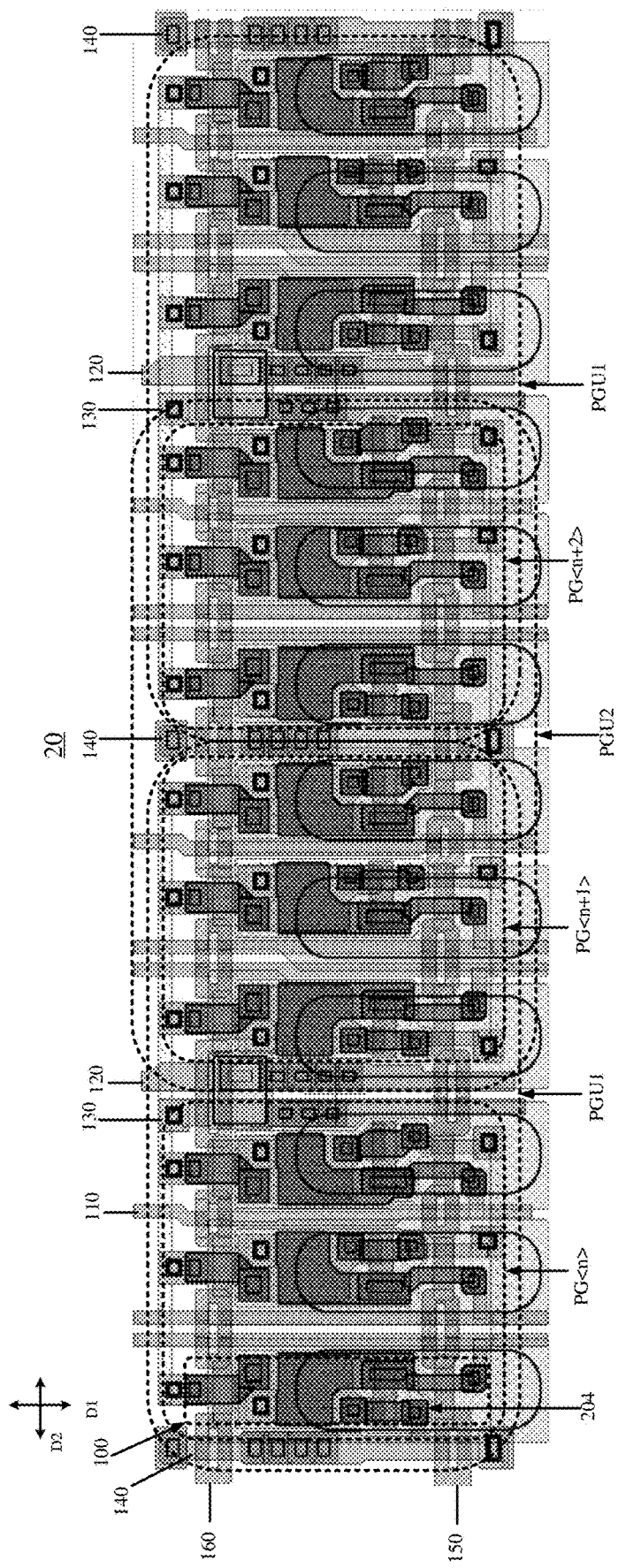
FIG. 3 is a third schematic diagram of a display substrate according to at least one embodiment of the present disclosure.
Figure 4:
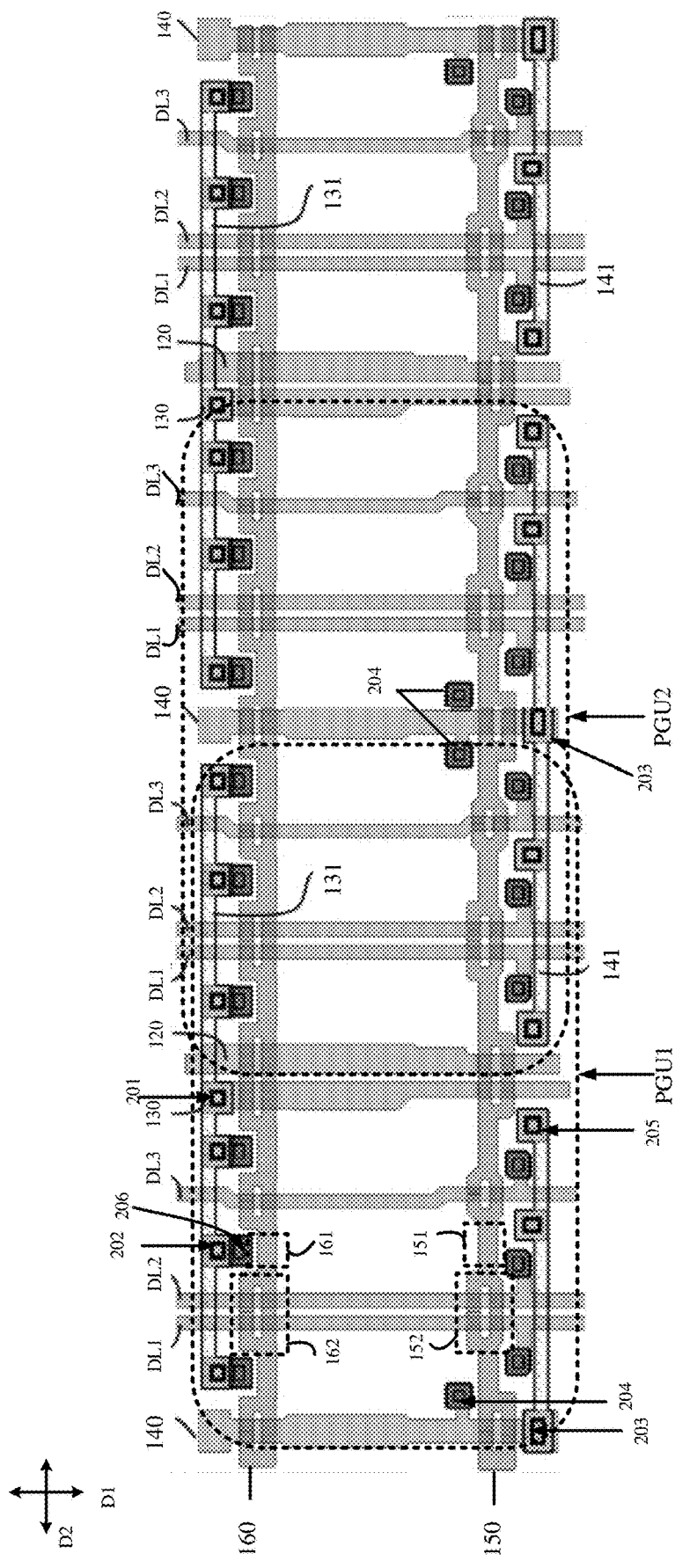
FIG. 4 is a fourth schematic diagram of a display substrate according to at least one embodiment of the present disclosure.
Figure 5:
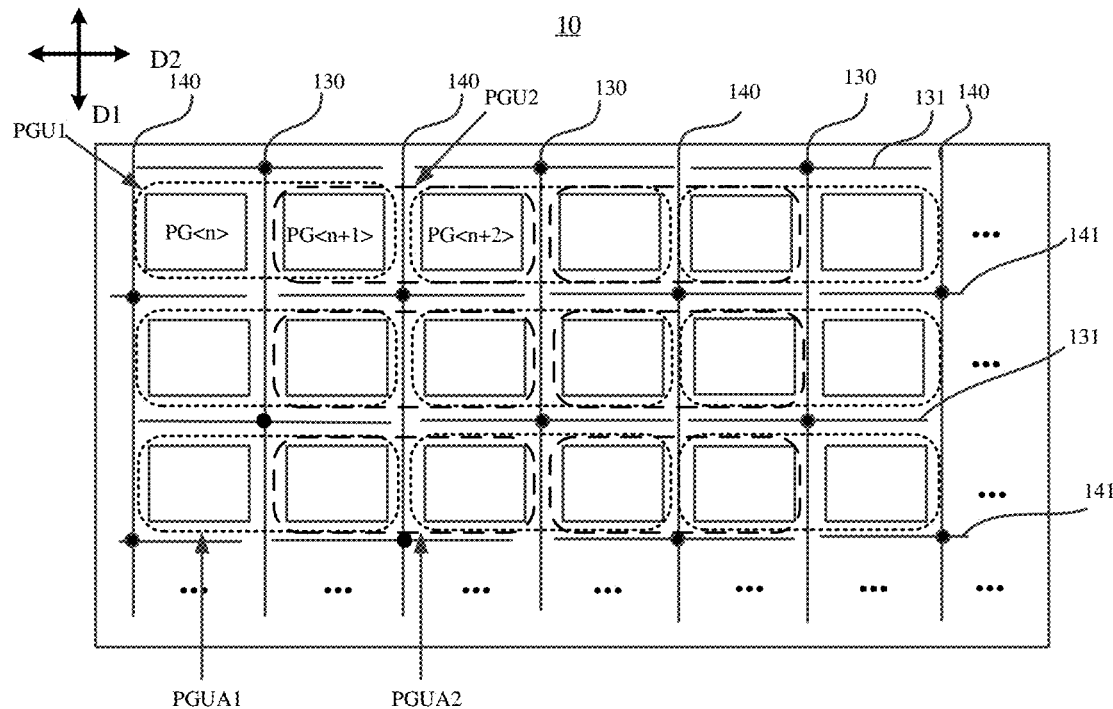
FIG. 5 is a fifth schematic diagram of a display substrate according to at least one embodiment of the present disclosure.

FIG. 3 shows another schematic diagram of a display substrate according to at least one embodiment of the present disclosure, FIG. 4 shows a schematic diagram of signal lines of the display substrate corresponding to FIG. 3, and FIG. 5 is a schematic diagram of a display substrate according to another embodiment of the present disclosure.

In FIG. 3, twelve adjacent sub-pixels 100 in a row of sub-pixels are exemplarily shown; in FIG. 4, for the sake of clarity, the specific structure of the sub-pixels is omitted; FIG. 5 schematically shows the case of a plurality of rows of sub-pixels. The arrangement of signal lines in the display substrate according to an embodiment of the present disclosure will be exemplarily described with reference to FIGS. 2A and 3 to 5, but the present disclosure is not limited thereto.

As shown in FIGS. 3 to 5, for each row of sub-pixels, in the second direction D2, the n-th sub-pixel group PG<n> and the (n+1)th sub-pixel group PG<n+1> constitute a first sub-pixel group unit PGU1, thereby providing a first sub-pixel group unit array PGUA1 including a plurality of first sub-pixel group units; the (n+1)th sub-pixel group PG<n+1> and the (n+2)th sub-pixel group PG<n+2> constitute a second sub-pixel group unit PGU2, thereby providing a second sub-pixel group unit array PGUA2 including a plurality of second sub-pixel group units; here, n is an odd or even number greater than 0. The adjacent first and second sub-pixel group units PGU1 and PGU2 share one sub-pixel group PG (PG <n+1>). The column directions of the first sub-pixel group unit array PGUA1 and the second sub-pixel group unit array PGUA2 are both in the first direction D1.

For example, referring to FIGS. 2A and 3, the plurality of first detection lines 130 are correspondingly connected to the plurality of columns of the first sub-pixel group unit PGU1 respectively, and the second electrodes of the third transistors T3 of the sub-pixels in the first sub-pixel group unit PGU1 located in the same column are all electrically connected to the same corresponding first detection line 130.

For example, each of the first detection lines 130 is located between the n-th sub-pixel group PG<n> and the (n+1)th sub-pixel group PG<n+1> of the correspondingly connected first sub-pixel group unit PGU 1. As shown in FIGS. 2A and 3, in each first sub-pixel group unit PGU1, a third sub-pixel P3 in the n-th sub-pixel group PG<n> is adjacent to a first sub-pixel P1 in the (n+1)th sub-pixel group PG<n+1>, and the first detection line 130 correspondingly connected to the first sub-pixel group unit PGU1 is located between the third sub-pixel P3 in the n-th sub-pixel group PG<n> and the first sub-pixel P1 in the (n+1)th sub-pixel group PG<n+1>.

For example, as shown in FIG. 3, the plurality of auxiliary electrode lines 120 and the plurality of first detection lines 130 are disposed in one-to-one correspondence, and each auxiliary electrode line 120 is directly adjacent to its corresponding first detection line 130 without a sub-pixel disposed therebetween.

For example, as shown in FIG. 2B, the first detection line 130 and the auxiliary electrode line 120 are disposed in the same layer and made of a same material, and are insulated from each other.

For example, the first detection line 130 may be disposed in parallel connection with other electrodes to reduce the resistance on the first detection line 130. For example, referring to FIGS. 2A and 6C, the first detection line 130 is connected in parallel to the connection electrode 127 in the second conductive layer 502 through the via hole 305, and the connection electrode 127 and the scan line in the display substrate are disposed in the same layer and made of a same material, and are insulated from each other.

For example, as shown in FIGS. 3 to 5, the display substrate 110 further includes a plurality of detection line segments 131 extended in the second direction D2. Each row of sub-pixels is correspondingly provided with a plurality of detection line segments 131 spaced apart from one another, the plurality of detection line segments 131 are connected to the plurality of first sub-pixel group units PGU1 in the row of sub-pixels in one-to-one correspondence respectively, and the second electrodes of the third transistors T3 in the sub-pixels in each first sub-pixel group unit PGU1 are both electrically connected to a corresponding detection line segment 131. As shown in FIG. 5, the plurality of detection line segments 131 corresponding to the plurality of rows of sub-pixels are arranged into a detection line array, and the column direction of the detection line array is the first direction D1. The plurality of first detection lines 130 are respectively electrically connected to the plurality of columns of detection line segments 131 in the detection line array in one-to-one correspondence, and the plurality of detection line segments 131 located in the same column respectively intersect with one corresponding first detection line 130 and are electrically connected with the corresponding first detection line 130 through the via hole 201, so as to connect the first detection line to the third transistor T3 in each corresponding sub-pixel 100. Referring to FIGS. 3 and 4, each of the detection line segments 131 is electrically connected to the second electrode of the third transistor T3 of each sub-pixel in the corresponding first sub-pixel group unit PGU1 through the via hole 202.

For example, the display substrate 10 further includes a plurality of first power lines 140 extended in the first direction D1, and the plurality of first power lines 140 are configured to provide a first power voltage V1 for the plurality of sub-pixels; the first power voltage is exemplarily a high power voltage VDD. As shown in FIGS. 3 and 4, any one of the first power lines 140 is not overlapped with the detection line segment 131 in a direction perpendicular to the base substrate 101, i.e., the first power line 140 is disposed corresponding to an interval of adjacent detection line segments 131. This arrangement reduces the overlap of signal lines and thus effectively reduces the parasitic capacitance between the signal lines and the signal delay caused thereby.

For example, as shown in FIGS. 3 and 4, each of the first power lines 140 is spaced from any one of the plurality of data lines 110 by at least one column of sub-pixels; that is, the first power line 140 is not directly adjacent to any one of the data lines 110. With such an arrangement, the signal delay on the data line caused by the resistance-capacitance load due to the directly adjacency of the data line and the first power line is avoided, and the problems of color shift, non-uniform display, or the like caused by the delay are further avoided.

For example, any one of the first power lines 140 is spaced from any one of the auxiliary electrode lines 120 by at least one sub-pixel group PG. For example, as shown in FIGS. 3 and 4, the first power line 140 and the auxiliary electrode line 120 are alternately disposed between adjacent sub-pixel groups PG. This arrangement may improve wiring uniformity, thereby reducing wiring density and the risk of short circuits.

For example, as shown in FIGS. 3 and 4, the plurality of first power lines 140 are correspondingly connected to the plurality of columns of the second sub-pixel group unit PGU2 respectively, and the second electrodes of the first transistors T1 of the sub-pixels in the second sub-pixel group unit PGU2 in the same column are electrically connected to one corresponding first power line 140.

For example, as shown in FIGS. 3 and 4, each of the first power lines 140 is located between the (n+1)th sub-pixel group PG<n+1> and the (n+2)th sub-pixel group PG <n+2> in the correspondingly connected second sub-pixel group unit PGU 2. In each second sub-pixel group unit PGU2, the third sub-pixel P3 in the (n+1)th sub-pixel group PG<n+1> is adjacent to the first sub-pixel P1 in the (n+2)th sub-pixel group PG<n+2>, and the first power line 140 correspondingly connected to the second sub-pixel group unit PGU2 is located between the third sub-pixel P3 in the (n+1)th sub-pixel group PG<n+1> and the first sub-pixel P1 in the (n+2)th sub-pixel group PG<n+2>.

For example, the first power line 140 may be arranged in parallel connection with other electrodes to reduce the resistance on the first power line 140. For example, referring to FIGS. 2A and 6C below, the first power line 140 is connected in parallel to the connection electrode 128 in the second conductive layer 502 through the via hole 306, and the connection electrode 128 and the scan line in the display substrate are disposed in the same layer and insulated from each other, and made of the same material.

For example, as shown in FIGS. 3 and 4, the display substrate 110 further includes a plurality of power line segments 141 extended in the second direction D2. Each row of sub-pixels is correspondingly provided with a plurality of power line segments 141 spaced apart from one another, the plurality of power line segments 141 connected to the plurality of second sub-pixel group units PGU2 in the row of sub-pixels in one-to-one correspondence respectively, and the second electrode of the first transistor T1 in the sub-pixel in each second sub-pixel group unit PGU2 is electrically connected to a corresponding detection line segment 131. As shown in FIG. 4, the plurality of power line segments 141 corresponding to the plurality of rows of sub-pixels are arranged into a power line array, and the column direction of the power line array is the first direction D1. The plurality of first power lines 140 are electrically connected to the plurality of columns of power line segments 141 in the power line array in one-to-one correspondence respectively, and the plurality of power line segments 141 located in the same column intersect with the same one corresponding first power line 140 respectively and are electrically connected through the via hole 203 with the corresponding first power line 140.

Referring to FIGS. 3 and 4, for each of the second sub-pixel group units PGU2, the first power line 140 is electrically connected to the second electrode of the first transistor T1 in the sub-pixels (the first sub-pixel in the (n+1)th sub-pixel group PG<n+1> or the third sub-pixel P3 in the (n+2)th sub-pixel group PG<n+2>) adjacent to the first power line 140 through the via hole 204; each power line segment 141 is electrically connected to the second electrode of the first transistor T1 in the sub-pixels, which are not adjacent to the first power line 140, through the via hole 205, thereby connecting the first power line 140 to the second electrode of the first transistor T1 in the sub-pixels. As shown in FIG. 2A, the first power line 140 is directly electrically connected to the second electrode of the first transistor T1 in the sub-pixel through the via hole 204, so that the first transistor T1 is prevented from being extended to overlap the scan line, and the parasitic capacitance between the signal lines is reduced.

For example, as shown in FIG. 4, the first power line 140 is disposed closely adjacent to the sub-pixel, that is, no other signal line is present between the first power line 140 and the sub-pixel, so that the first power line 140 may be electrically connected to the sub-pixels on the left and right sides through the via hole 204.

Referring to FIGS. 4 and 5, the power line segment 141 is not overlapped with either of the first detection line 130 and the auxiliary electrode line 120 in the direction perpendicular to the base substrate 110; that is, the first detection line 130 and the auxiliary electrode line 120 are disposed corresponding to the interval of the adjacent power line segments 141. This arrangement reduces the overlap of the signal lines and thus effectively reduces the parasitic capacitance between the signal lines and the signal delay caused thereby.

For example, in a display substrate, a mesh electrode may be used to provide a first power voltage, and the plurality of sub-pixels in the display substrate are connected to the mesh electrode to receive the first power voltage, and a structure using the mesh electrode is referred to as a mesh structure. When a defect (e.g., a short circuit defect or a fracture defect) occurs at any position of the mesh electrode in the display substrate having the mesh structure, all the sub-pixels in the display substrate are affected.

As described above, with respect to the mesh structure, the first power line 140 in the display substrate 10 according to the embodiment of the present disclosure adopts a non-mesh structure. Even when a failure occurs in one of the first power lines 140, only the sub-pixels connected to the one first power line 140 are affected, without affecting the sub-pixels connected to other first power lines 140, so that redundancy and stability of the display substrate 10 may be improved; and this configuration facilitates the detection of the defect.

For example, before leaving the factory, the display substrate 10 may be detected to determine whether the product requirements are met. For example, in the detection phase, whether the failure occurs may be determined by detecting parameters, such as voltages and currents on the plurality of first power lines 140, respectively. With respect to the display panel using the mesh structure, the display substrate 10 using the non-mesh structure according to the embodiment of the present disclosure may position the first power line 140 where the defect occurs, so that the defect may be eliminated.

Referring to FIGS. 3 and 4, for example, the display substrate 10 further includes a plurality of first scan lines 150 and a plurality of second scan lines 160 extended in the second direction D2, and each row of sub-pixels is correspondingly connected to one of the first scan lines 150 and one of the second scan lines 160 respectively. The plurality of first scan lines 150 are connected to the gate electrodes of the first transistors T1 in the plurality of rows of sub-pixels respectively to provide the first control signal G1, and the plurality of second scan lines 160 are connected to the gate electrodes of the third transistors T3 in the plurality of rows of sub-pixels respectively to provide the second control signal G2. For example, the first scan line 150 is integrated with the gate electrode of the second transistor T2 of one corresponding row of sub-pixels (the same electrode block), and the second scan line 160 is integrated with the gate electrode of the third transistor T3 of one corresponding row of sub-pixels (the same electrode block).

It should be noted that the first scan line and the second scan line are omitted in FIG. 5 for clarity.

For example, as shown in FIGS. 3 and 4, for each row of sub-pixels, in the first direction D1, the corresponding first scan line 150 and second scan line 160 are respectively located on two sides of the first transistor T1 in the row of sub-pixels.

For example, as shown in FIG. 4, each of the first scan lines 150 includes a first portion 151 and a second portion 152 connected alternately, the second portion 152 has a ring structure, and the second portion 152 has a larger size than the first portion 151 in the first direction D1. Each of the second portions 152 intersects with at least one of the data line 110, the auxiliary electrode line 120, the first detection line 130, and the first power supply line 140 in the direction perpendicular to the base substrate 101.

Similarly, each of the second scan lines 160 includes a first portion 161 and a second portion 162 connected alternately, the second portion 162 has a ring structure, and the size of the second portion 162 is larger than that of the first portion 161 in the first direction D1. Each of the second portions 162 intersects with at least one of the data line 110, the auxiliary electrode line 120, the first detection line 130, and the first power supply line 140 in the direction perpendicular to the base substrate 101.

By arranging the portions where the scan line intersects with the data line 110, the auxiliary electrode line 120, the first detection line 130, and the first power line 140 into a ring structure, i.e., a dual-channel structure, the yield of the device may be effectively improved. For example, the position where the signal lines intersect is easy to cause a short-circuit failure due to electrostatic breakdown of the parasitic capacitance. During detection, when it is detected that a short-circuit failure occurs in one channel of the ring structure, the channel may be cut off (for example, by laser cutting), and the circuit structure may still normally work through the other channel.

Since the width of the second portion is greater than the width of the first portion, the first portion is sandwiched between adjacent second portions to form a concave structure. In the layout design, structures such as via holes may be designed corresponding to the concave structures, so that the pixel density is improved.

For example, as shown in FIG. 3, a channel region of the third transistor T3 is overlapped with the first portion 161 of the second scan line 160 in the direction perpendicular to the base substrate 101, and is not overlapped with the second portion 162 of the second scan line 160 in the direction perpendicular to the base substrate. For example, as shown in FIG. 4, the second electrode of the third transistor T3 is electrically connected to an active layer of the third transistor T3 through the via hole 206, and the via hole 206 corresponds to the concave structure, thereby saving layout space.

For example, adjacent signal lines correspond to the same second portion of the scan line, thereby reducing the second portion. For example, as shown in FIG. 4, the auxiliary electrode line 120 is adjacent to the first detection line 130, so that they may correspond to the same second portion of the scan line, thereby saving the layout space.

For example, the first portion 151 of the first scan line 150 is integrated with the gate electrode of the second transistor T2 of one corresponding row of sub-pixels (the same electrode block), and the first portion 161 of the second scan line 160 is integrated with the gate electrode of the third transistor T3 of one corresponding row of sub-pixels (the same electrode block).

By connecting the auxiliary electrode line in parallel with the second electrode of the light emitting element, the display substrate according to some embodiments of the present disclosure reduces the voltage drop (or voltage rise) on the second electrode, thereby improving the display quality of the display substrate. The display substrate according to some other embodiments of the present disclosure improves the display quality of the display substrate by reducing the voltage drop (or voltage rise) on the first electrode of the light emitting element.

As shown in FIG. 1B, the first electrode of the light emitting element is electrically connected to the first electrode of the first transistor T1, the first electrode of the third transistor T3, and the second capacitor electrode of the storage capacitor Cst and is connected to a node S. In this sutuation, if the resistances of the first electrode of the light emitting element, the first electrode of the first transistor T1, the first electrode of the third transistor T3, and the second capacitor electrode of the storage capacitor Cst are large, and a large voltage drop is caused, the potential at the node S will be lost, thereby affecting the gray scale value to be actually displayed by the corresponding sub-pixel, and causing color shift, non-uniform display, or the like.

Some embodiments of the present disclosure provide a display substrate which reduces a distance between via holes, shortens a charge move path, decreases the voltage drop on the wire, and improves the display effect of the display substrate by arranging the via hole connecting the first electrode of the third transistor T3 and the light emitting element in the sub-pixel to be at least overlapped with the via hole connecting the first electrode of the third transistor T3 with the active layer of the third transistor in the direction perpendicular to the base substrate.

A specific structure of the sub-pixel in the display substrate 10 shown in FIG. 2A will be described below. For convenience of explanation, in the following description, the gate electrode, the first electrode, the second electrode, and the active layer of the first transistor T1 are respectively denoted by T1g, T1s, T1d, and T1a; the gate electrode, the first electrode, the second electrode, and the active layer of the second transistor T2 are respectively denoted by T2g, T2s, T2d, and T2a; the gate electrode, the first electrode, the second electrode, and the active layer of the third transistor T3 are respectively denoted by T3g, T3s, T3d, and T3a; and the first capacitor electrode, the second capacitor electrode, and the third capacitor electrode of the storage capacitor Cst are respectively denoted by Ca, Cb, and Cc.

It should be noted that "disposed in the same layer" in the present disclosure refers to a structure formed by two (or more) structures being formed by the same deposition process and patterned by the same patterning process, and the materials thereof may be the same or different. The "integral structure" in the present disclosure means a structure in which two (or more) structures are connected to each other by being formed through the same deposition process and patterned through the same patterning process, and their materials may be the same or different.

Corresponding to FIG. 2A, FIGS. 6A to 6D show the patterns of the first conductive layer 501, the semiconductor layer 504, the second conductive layer 502 and the third conductive layer 503 in the sub-pixels of the display substrate 10 respectively, and it should be noted that only the corresponding structures of the adjacent six sub-pixels in one row of sub-pixels are shown exemplarily, but this should not be taken as a limitation to the present disclosure. The first conductive layer 501, the first insulating layer 102, the semiconductor layer 504, the second insulating layer 103, the second conductive layer 502, the third insulating layer 104, and the third conductive layer 503 are arranged on the base substrate 101 successively, thereby forming the structure shown in FIG. 2A.

Figure 6A:
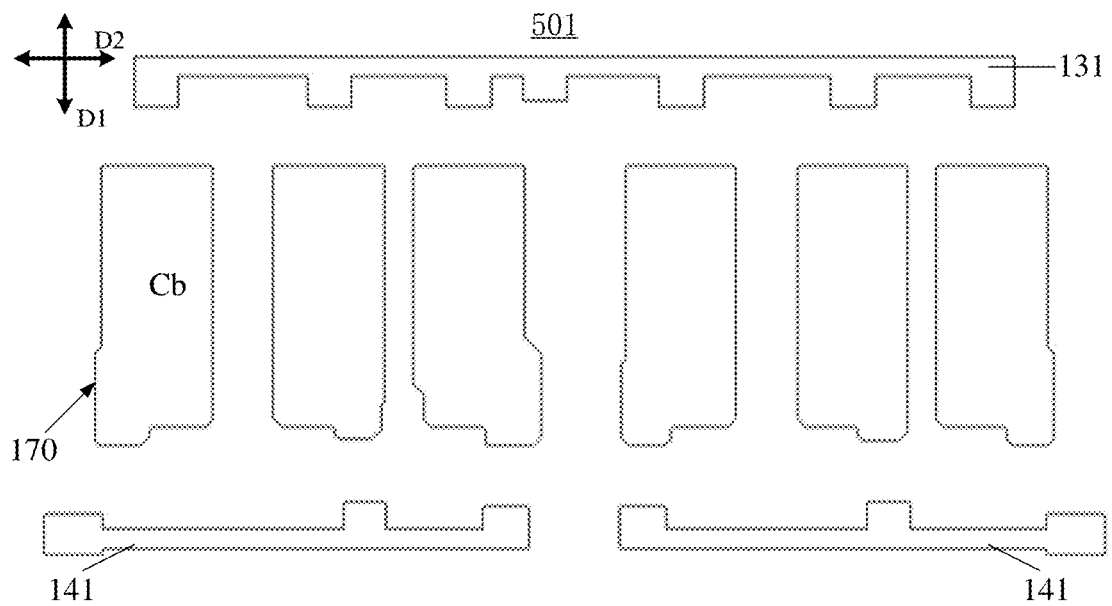
FIG. 6A is a schematic plan view of a first conductive layer in a display substrate according to at least one embodiment of the present disclosure.

Referring to FIGS. 2A and 6A, for example, the first conductive layer 501 includes a detection line segment 131, a power line segment 141, and a second capacitor electrode Cb of the storage capacitor Cst, which are insulated from one another.

Figure 6B:
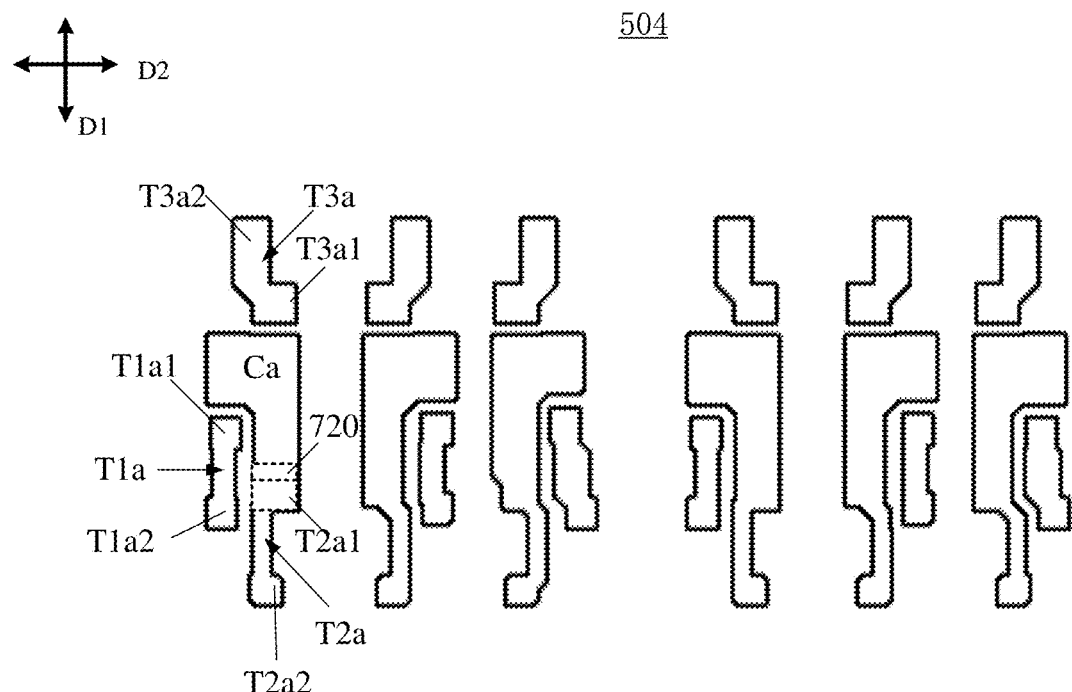
FIG. 6B is a schematic plan view of a semiconductor layer in a display substrate according to at least one embodiment of the present disclosure.

Referring to FIGS. 2A and 6B, for example, the semiconductor layer 504 includes an active layer T1a of the first transistor T1, an active layer T2a of the second transistor T2, and an active layer T3a of the third transistor T3, which are spaced apart from one another.

Figure 6C:
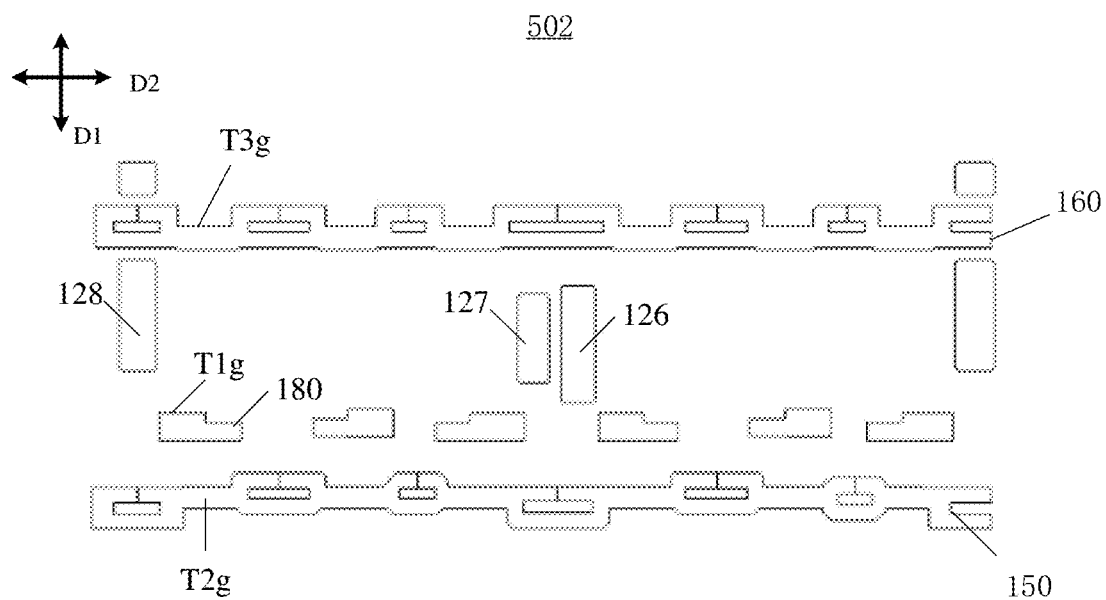
FIG. 6C is a schematic plan view of a second conductive layer in a display substrate according to at least one embodiment of the present disclosure.
Figure 6D:
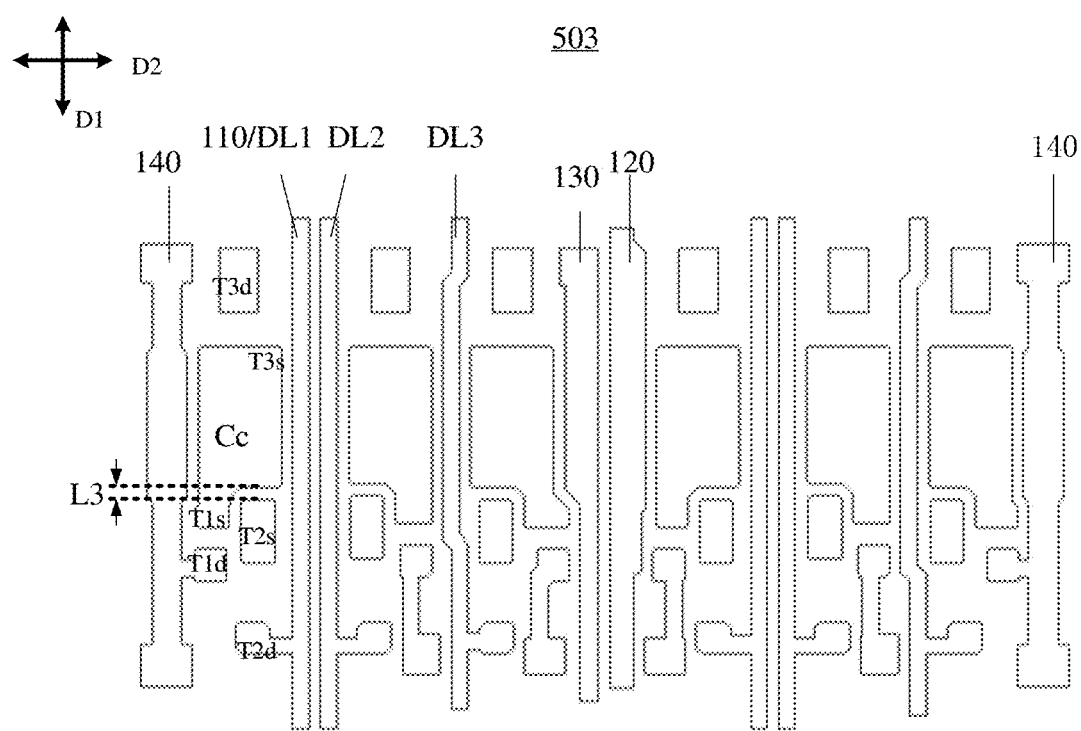
FIG. 6D is a schematic plan view of a third conductive layer in a display substrate according to at least one embodiment of the present disclosure.

Referring to FIGS. 2A and 6C, for example, the second conductive layer 502 includes the first scan line 150 and the second scan line 160 insulated from each other, and further includes the gate electrode T1g of the first transistor T1, the gate electrode T2g of the second transistor T2, and the gate electrode T3g of the third transistor T3 insulated from one another. For example, the first scan line 150 is integrated with the gate electrodes T2g of the second transistors T2 of one corresponding row of sub-pixels, and the second scan line 160 is integrated with the gate electrodes T3g of the third transistors T3 of one corresponding row of sub-pixels respectively.

Referring to FIGS. 2A and 6D, for example, the third conductive layer 503 includes the data line 110 (DL1, DL2, DL3), the auxiliary electrode line 120, the first detection line 130, and the first power line 140, which are insulated from one another, and further includes first and second electrodes T1s and T1d of the first transistor T1, first and second electrodes T2s and T2d of the second transistor T2, and first and second electrodes T3s and T3d of the third transistor T3. For example, the first power line 140 is integrated with the second electrode T1d of the first transistor T1 in the (nearest) sub-pixels directly adjacent to the first power line 140. For example, each data line 110 is integrated with the second electrodes T2d of the second transistors T2 in the sub-pixel connected to the data line.

For example, the material of the semiconductor layer 504 includes, but not limited to, silicon-based materials (amorphous silicon a-Si, polysilicon p-Si, or the like), metal oxide semiconductors (IGZO, ZnO, AZO, IZTO, or the like), and organic materials (hexathiophene, polythiophene, or the like).

For example, the material of the first conductive layer 501, the second conductive layer 502, and the third conductive layer 503 may include gold (Au), silver (Ag), copper (Cu), aluminum (Al), molybdenum (Mo), magnesium (Mg), tungsten (W), or an alloy material of any combination thereof; or a conductive metal oxide material, such as indium tin oxide (ITO), indium zinc oxide (IZO), zinc oxide (ZnO), zinc aluminum oxide (AZO), etc.

For example, the semiconductor layer 504 further includes the first capacitor electrode Ca of the storage capacitor Cst, and the first capacitor electrode Ca is obtained by making the semiconductor layer 504 conductive; that is, the first capacitor electrode Ca is disposed in the same layer as the active layer T1a of the first transistor T1, the active layer T2a of the second transistor, and the active layer T3a of the third transistor.

For example, referring to FIGS. 2A and 6B, the first capacitor electrode Ca is connected with the active layer T2a of the second transistor T2, and the first capacitor electrode Ca is spaced apart and insulated from both the active layer T1a of the first transistor and the active layer T3a of the third transistor. As shown in FIG. 6B, the first capacitor electrode Ca and the active layer T2a of the second transistor are connected to each other to form a complete pattern portion.

For example, the display substrate 10 adopts a self-alignment process, and the semiconductor layer 504 is conducted (e.g., doped) by using the second conductive layer 502 as a mask, so that the portion of the semiconductor layer 504 not covered by the second conductive layer 502 is conducted, so that the first capacitor electrode Ca is obtained, and the portions of the active layer of each transistor on both sides of the channel region are conducted to form a first electrode contact region and a second electrode contact region respectively, which are configured to be respectively electrically connected to the first electrode and the second electrode of the transistor. FIG. 6B shows the first and second electrode contact regions T1a1 and T1a2 of the active layer T1a of the first transistor T1, the first and second electrode contact regions T2a1 and T2a2 of the active layer T2a of the second transistor T2, and the first and second electrode contact regions T3a1 and T3a2 of the active layer T3a of the third transistor T3.

For example, the display substrate 10 further includes a shielding layer 170 located on a side of the sub-pixel 100 close to the base substrate, and an orthogonal projection of the shielding layer 170 on the base substrate 101 covers an orthogonal projection of the active layer T1a of the first transistor T1 on the base substrate 101.

Because the first transistor T1 is a drive transistor of the pixel circuit, stabilization of the electrical characteristics of the first transistor T1 is very important for the light emission characteristics of the light-emitting element. The shielding layer 170 is an opaque layer, which may avoid a shift of the threshold voltage of the first transistor T1 caused by light being incident on the active layer of the first transistor T1 from a backside of the base substrate 101, thereby preventing the light emitting characteristics of the corresponding light emitting element connected with the first transistor T1 from being affected.

For example, the shielding layer 170 is an opaque conductive material, such as a metal or metal alloy material. This arrangement may alleviate the back channel phenomenon of the base substrate 101 caused by trapped charges.

For example, the shielding layer 170 and the second capacitor electrode Cb of the storage capacitor Cst are disposed in the same layer and made of the same material. For example, the shielding layer 170 and the second capacitor electrode Cb of the storage capacitor Cst are the same electrode block. In this case, the shielding layer 170 is connected to the first electrode T3s of the third transistor T3, so as to prevent the threshold voltage of the transistor from being affected by a potential change in a floating shielding layer during the display operation.

Figure 7:
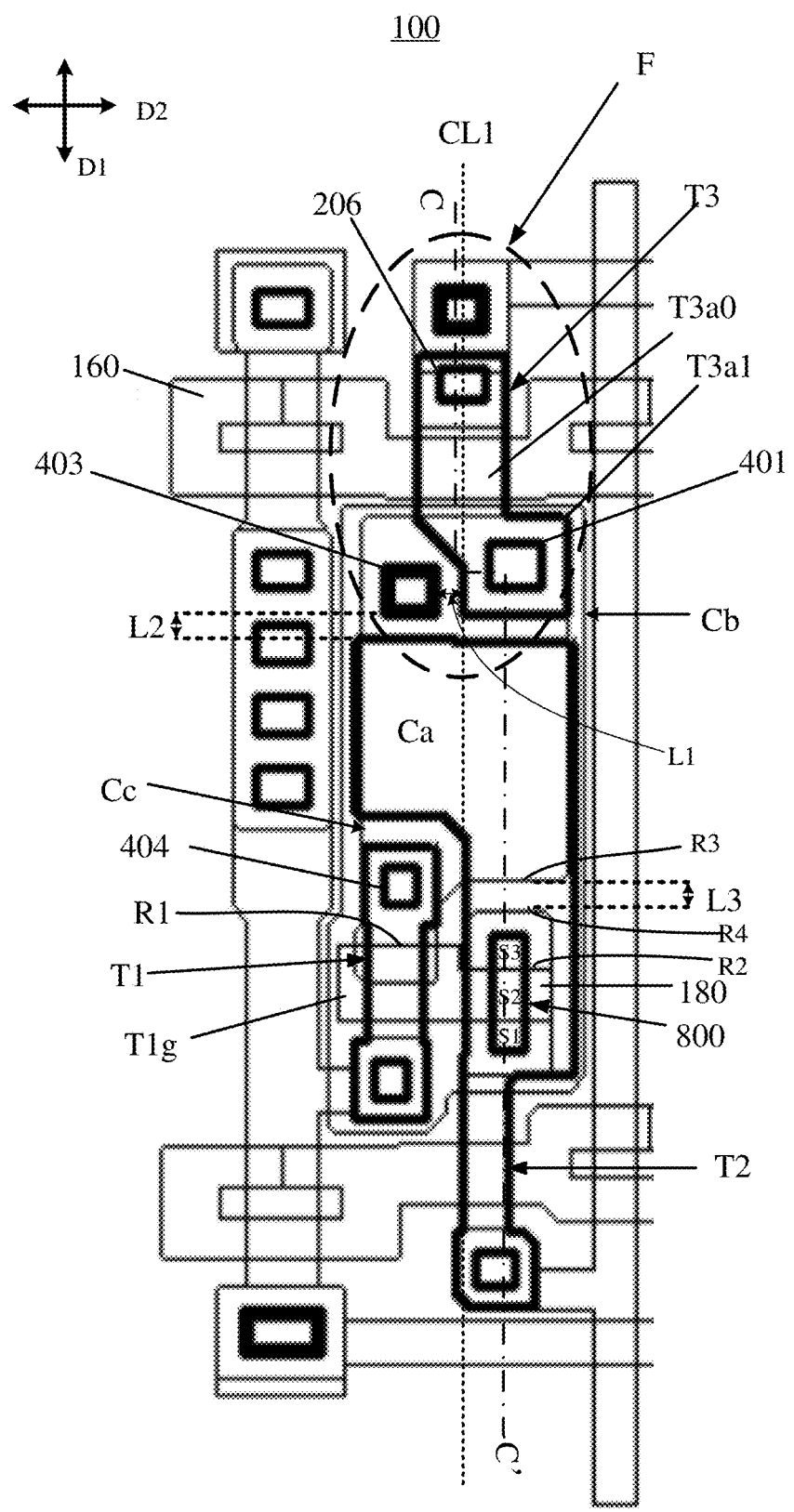
FIG. 7 is a sixth schematic diagram of a display substrate according to at least one embodiment of the present disclosure.
Figure 8A:
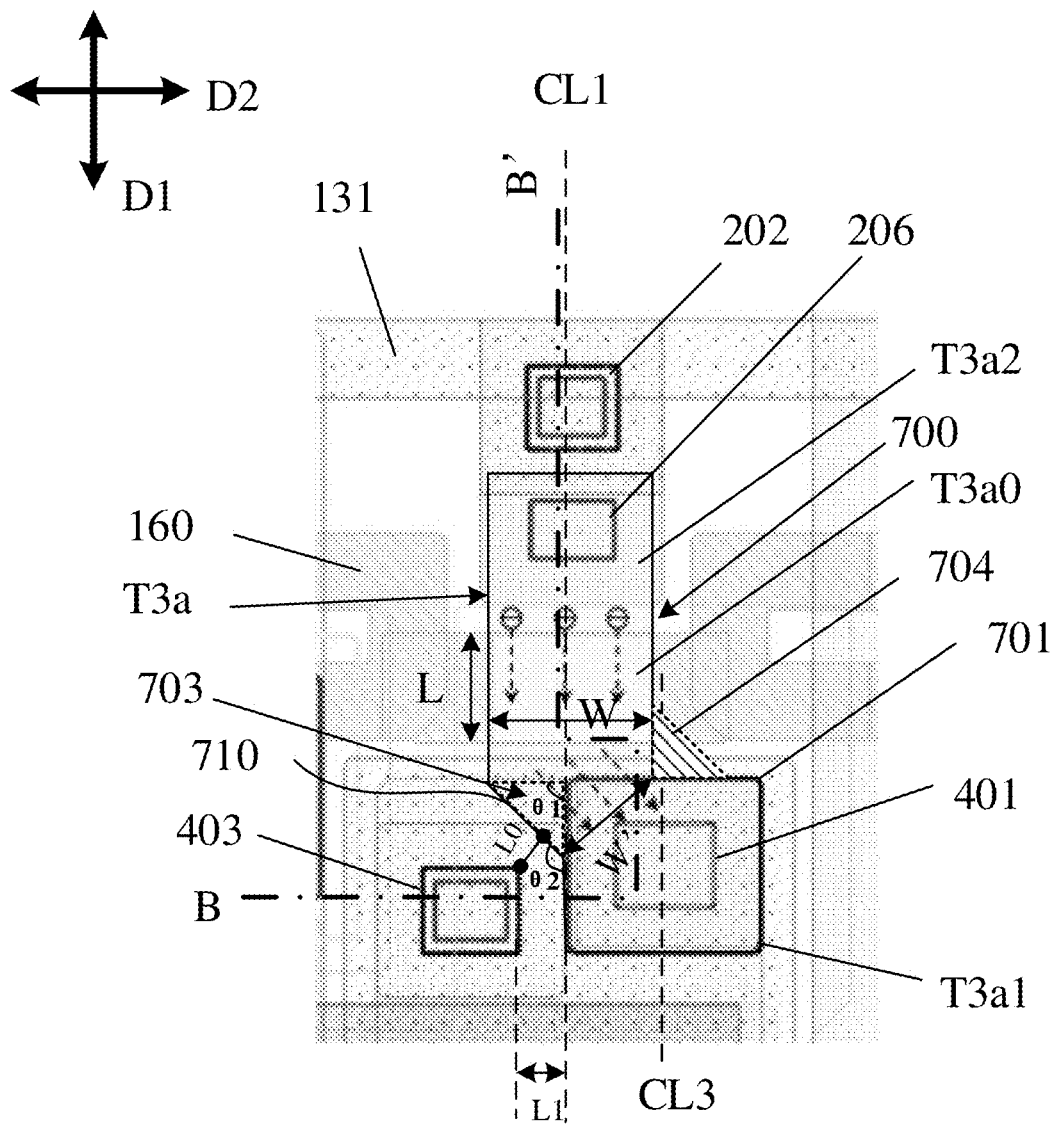
FIG. 8A is a partially enlarged view of FIG. 7.
Figure 8B:
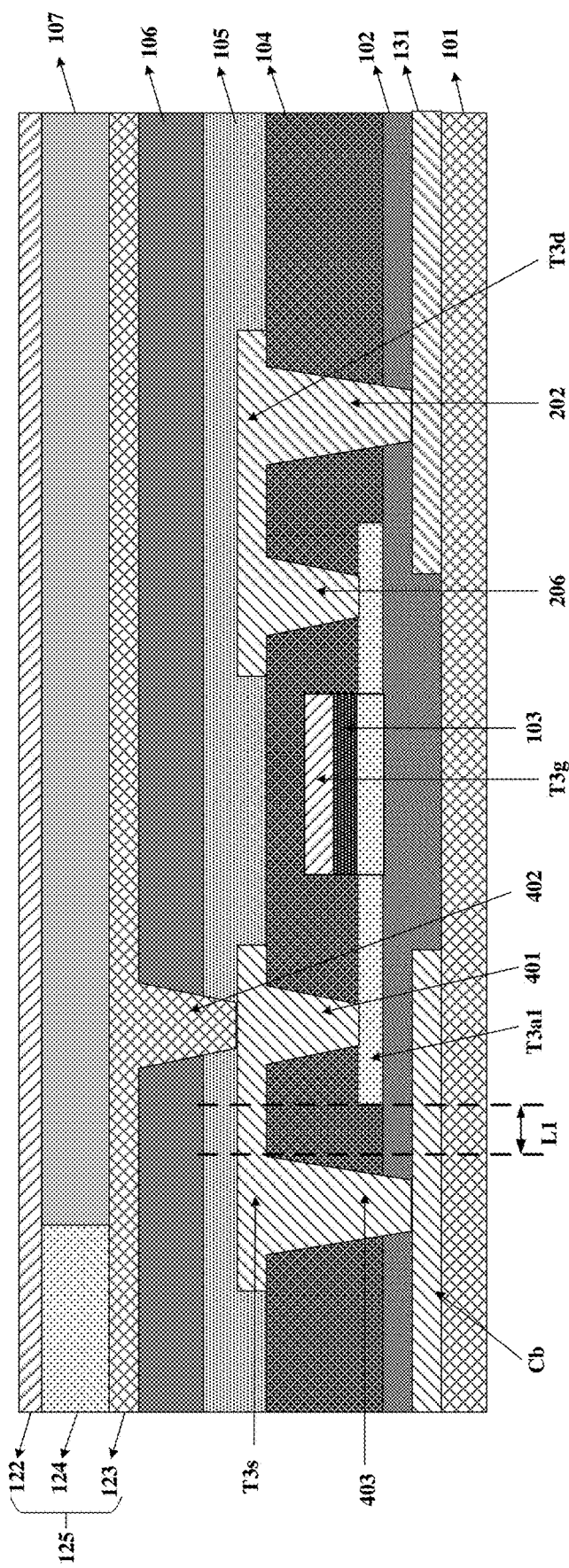
FIG. 8B is a sectional view of FIG. 8A along section line B-B'.

For the sake of clarity, FIG. 7 shows a schematic diagram of one sub-pixel, FIG. 8A is a schematic enlarged diagram of region F in FIG. 7, and FIG. 8B is a sectional view of FIG. 8A along section line B-B'.

Referring to FIGS. 7, 8A and 8B, the first electrode T3s of the third transistor T3 is electrically connected to the active layer T3a of the third transistor T3 through a via hole 401 (an example of a second via hole of the embodiment of the present disclosure), and is configured to be electrically connected to the first electrode 123 of the light emitting element 125 through a via hole 402. The via hole 401 at least partially overlaps the via hole 402 in the direction perpendicular to the base substrate 101.

For example, as shown in FIG. 8B, the second insulating layer 103 does not overlap with the semiconductor layer 504 in the direction perpendicular to the base substrate 101, so as to facilitate a conducting process on the semiconductor layer 504; for example, when a region of the semiconductor layer 504 which is not covered with the second conductive layer 502 is conducted by ion implantation, the implanted ions may not be blocked by the second insulating layer 103. For example, the second insulating layer 103 is disposed only corresponding to the second conductive layer 502; that is, the second insulating layer 103 and the second conductive layer 502 coincide in the direction perpendicular to the base substrate 101.

For example, as shown in FIGS. 8A and 8B, the first electrode T3s of the third transistor T3 is electrically connected to the second capacitor electrode Cb of the storage capacitor Cst via a via hole 403 (an example of a first via hole of the embodiment of the present disclosure), and the via hole 403 is closely adjacent to the via hole 401 at intervals; that is, no other circuit structures (such as another via hole or a wire) are present between the via hole 401 and the via hole 403. For example, the distance between the via holes 403 and 401 is as small as possible, for example, the minimum distance between the via holes 403 and 401 is the minimum size that satisfies the Design Rule in the manufacturing process of the display substrate 10, so as to ensure the yield of the via hole. The design rule relate to the process capability of the device, the fabrication process, the depth of the via hole, and the thickness of the material layer.

For example, as shown in FIG. 8B, in order to avoid an adverse effect of a manufacturing process of the via hole 403 on the first electrode contact region T3a1 of the adjacent third transistor T3, and the minimum distance L1 between the orthographic projection of the via hole 403 and the orthographic projection of the first electrode contact region T3a1 on the base substrate 101 is required to meet the design rule between a via hole and a wire in the manufacturing process of the display substrate 10; for example, the minimum distance L1 is in a range of 0.5 μm to 6 μm, for example, 2 μm to 3 μm or 3 μm to 4 μm, and for example, 3.5 μm.

By disposing the via holes 403 and 401 adjacently, the distacne between the via holes is reduced, which may further shorten the charge move path and decrease the voltage drop on the first electrode T3s of the third transistor T3, thereby avoiding the loss of the potential at the node S and improving the display effect of the display substrate.

Figure 8C:
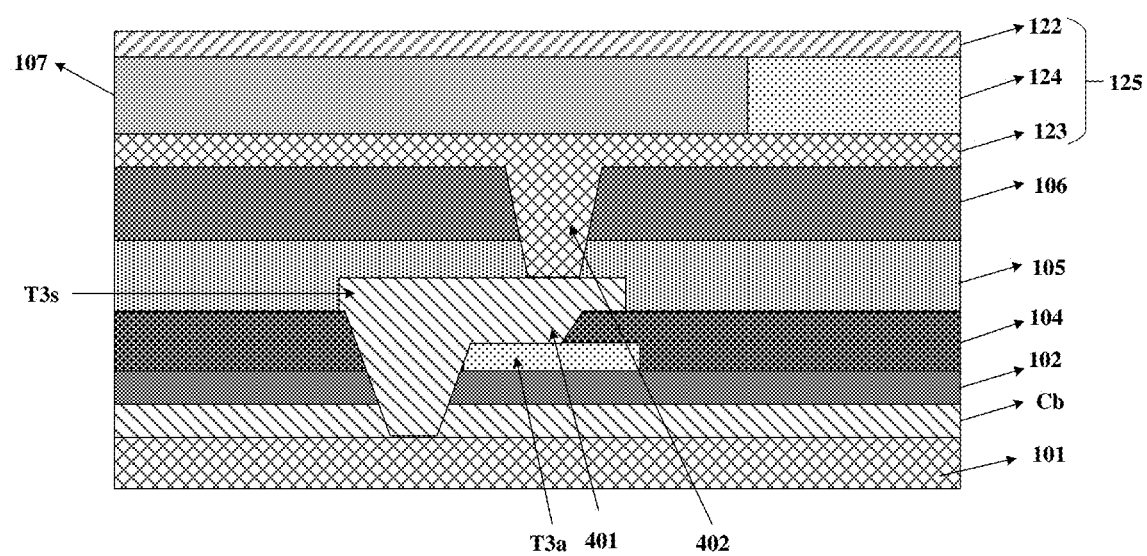
FIG. 8C is a sectional view of a display substrate according to another embodiment of the present disclosure.

In some other examples, as shown in FIG. 8C, the first electrode T3s of the third transistor T3 may also be electrically connected to the second capacitor electrode Cb through the first via hole 401. The arrangement may reduce the occupied layout space and improve an integration level of the display substrate, without considering the design rule between via holes.

Further, as shown in FIG. 8B, the first electrode via hole 401 of the third transistor T3 is close to an edge of the sub-pixel region, and the first electrode via hole 402 of the light emitting element is disposed to overlap the first electrode via hole 401, so that the via hole 402 may easily avoid a printing region of the light emitting layer 124 of the light emitting element 125 (i.e., the opening region of the sub-pixel). Referring to FIGS. 2B and 7, the opening region 600 of the pixel defining layer 107 does not cover the via holes 401 and 402; that is, the light emitting layer 124 of the light emitting element 125 is not overlapped with the via holes 401 and 402 in the direction perpendicular to the base substrate 101. This may avoid the influence on the light emitting efficiency of the light emitting layer 124 caused by the unevenness of the interface at the via hole 402.

As shown in FIG. 7, the first electrode of the first transistor T1 is electrically connected to the second capacitor electrode Cb through the via hole 404, the via hole 404 is closer to the center of the sub-pixel than the first electrode via hole 401 of the third transistor; for example, referring to FIG. 2A, the opening region 600 of the pixel defining layer 107 covers the via hole 404; that is, the light emitting layer 124 of the light emitting element 125 is overlapped with the via hole 404 in the direction perpendicular to the base substrate 101.

For example, referring to FIGS. 7, 8A and 8B, the via hole 403 electrically connected between the first electrode T3$s$ of the third transistor T3 and the second capacitor electrode Cb of the storage capacitor Cst is not overlapped with the first capacitor electrode Ca in the direction perpendicular to the base substrate 101, and the distance between the via hole 403 and the first capacitor electrode Ca is as small as possible, so that the first capacitor electrode Ca has a large area to be overlapped with the second capacitor electrode Cb to a greater degree, whereby a capacitance of the storage capacitor Cst may be increased. For example, the minimum distance L2 between the via hole 403 and the first capacitor electrode Ca is the minimum size that satisfies the Design Rule between the via hole and the routing line in the manufacturing process of the display substrate 10, so as to ensure the yield of the via hole and the routing line. The design rule relate to the process capability of the device, the process of fabricating the via hole, the depth of the via hole, the thickness of the semiconductor layer 504, or the like. For example, the minimum distance L2 between the orthographic projections of the via holes 403 and 401 on the base substrate 101 is in the range of 0.5 µm to 6 µm, for example 2 µm to 3 µm, 3 µm to 4 µm, for example 3.5 µm.

For example, as shown in FIG. 7, the channel length directions of the first transistor T1, the second transistor T2, and the third transistor T3 are parallel to one another, for example, parallel to the first direction D1.

For example, as shown in FIG. 7, the first electrode contact region T3$a$1 of the third transistor T3 is electrically connected to the first electrode of the third transistor T3 through the via hole 401, and a center line of the channel region T3$a$0 of the third transistor T3 in the first direction D1 is substantially located in a center line CL1 of the sub-pixel 100 in the first direction D1; for example, the center line of the channel region T3$a$0 of the third transistor T3 in the first direction D1 coincides with the center line CL1 of the sub-pixel 100 in the first direction D1.

It should be noted that the described center line CL1 of the sub-pixel in the first direction D1 refers to the center line in the first direction D1 of the sub-pixel region where the sub-pixel is located and which is defined by two signal lines extended in the first direction.

As described above, since the via hole 206, through which the second electrode of the third transistor T3 is connected to the second electrode contact region of the third transistor T3, corresponds to the concave structure of the second scan line 160, symmetrically disposing the channel region T3$a$0 of the third transistor T3 along the center line CL1 of the sub-pixel may improve the wiring uniformity, improve space utilization, and thus improve the pixel density.

For example, as shown in FIG. 7, the centers of the via holes 401 and 403 are located on both sides of the center line of the channel region T3$a$0 of the third transistor T3 in the first direction D1 respectively.

For example, referring to FIGS. 6B and 7, the first transistor T1 and the second transistor T2 are located on both sides of the center line CL1 of the sub-pixel in the first direction D1 respectively. The first electrode T1$s$ of the first transistor T1 is electrically connected to the active layer T1$a$ of the first transistor T1 through the via hole 404, and is electrically connected to the first capacitor electrode Ca, the first electrode T3$s$ of the third transistor T3, and the first electrode of the light emitting element.

For example, the storage capacitor Cst further includes a third capacitor electrode Cc, the third capacitor electrode Cc is electrically connected to the second capacitor electrode Cb, and the third capacitor electrode Cc and the second capacitor electrode Cb are both at least partially overlapped with the first capacitor electrode Ca in the direction perpendicular to the base substrate 101 to form a parallel capacitor structure, so as to increase the capacitance of the storage capacitor Cst. For example, the third capacitor electrode Cc, the second capacitor electrode Cb, and the first capacitor electrode Ca are all overlapped in the direction perpendicular to the base substrate 101.

For example, the third capacitor electrode Cc and the second capacitor electrode Cb are located on both sides of the first capacitor electrode Ca in the direction perpendicular to the base substrate 101 respectively. For example, the third capacitor electrode Cc is located on the side of the first capacitor electrode Ca away from the base substrate 101, and the second capacitor electrode Cb is located on the side of the first capacitor electrode Ca close to the base substrate 101.

For example, the third capacitor electrode Cc is located in the third conductive layer 503. For example, as shown in FIG. 6D, the first electrode T1$s$ of the first transistor T1, the first electrode T3$s$ of the third transistor T3, and the third capacitor electrode Cc are the same electrode block; that is, the third capacitor electrode Cc and the second capacitor electrode Cb are electrically connected through the via hole 403.

For example, as shown in FIG. 7, in the first direction D1, the via hole 401 and the via hole 403 are located on the same side (upper side in the drawing) of the first capacitor electrode Ca, and are located on an opposite side of the first capacitor electrode Ca to both the via hole 401 and the third transistor T3.

For example, as shown in FIG. 7, in the first direction D1, the first transistor T1 and the second transistor T2 are both disposed on the same side of the first capacitor electrode Ca, and are located on an opposite side of the first capacitor electrode Ca to the third transistor T3 and the via hole 401.

In some other embodiments of the present disclosure, as shown in FIG. 7, the display substrate 10 further includes an extension portion 180 protruding from the gate electrode T1g of the first transistor T1, and the extension portion 180 is formed by extended the gate electrode T1g in the second direction D2. For example, the extension portion 180 and the gate electrode T1g of the first transistor T1 are in one electrode pattern. The extension portion 180 is at least partially overlapped with the first electrode T2s of the second transistor T2 in the direction perpendicular to the base substrate 101 and is electrically connected to the first electrode T2s of the second transistor T2. In the first direction D1, the gate electrode T1g of the first transistor T1 has a first side R1 (upper edge) closest to the third capacitor electrode Cc, the extension portion 180 has a second side R2 (upper edge) closest to the third capacitor electrode Cc, and the second side R2 is recessed with respect to the first side R1 in a direction away from the third capacitor electrode Cc (downward in the drawing); that is, in the first direction D1, the first side R1 is closer to the third transistor T3 than the second side R2.

In the first direction D1, the third capacitor electrode Cc has a third side R3 (lower edge) closest to the first electrode T2s of the second transistor T2, the first electrode T2s of the second transistor T2 has a fourth side R4 (upper edge) closest to the third capacitor electrode Cc, and the third side R3 and the fourth side R4 are opposite to each other with a gap therebetween. The second side R2 of the extension portion 180 is recessed corresponding to the gap.

Referring to FIGS. 7 and 6D, the first electrode T2s of the second transistor T2 extends to crosses the extension portion 180 in the first direction D1 so as to be electrically connected to the first capacitor electrode Ca, and meanwhile the first electrode T2s of the second transistor T2 is required to be insulated from the third capacitor electrode Cc at an interval, and therefore, providing the second side R2 of the extension portion 180 to be recessed downwards, that is, moving the second side R2 downwards (toward the channel region of the second transistor T2) in the first direction D1, helps to facilitate the downward moving of the third side R3 (lower edge) of the third capacitor electrode Cc, so that the area of the third capacitor electrode Cc is increased, which contributes to an increase in the capacitance of the storage capacitor Cst.

For example, as shown in FIG. 6C, in the first direction D1, the size (width) of the extension portion 180 is less than the size (width) of the gate T1g of the first transistor T1.

For example, the gap between the third side R3 and the fourth side R4 exposes the first capacitor electrode Ca; for example, the size L3 of the gap in the first direction D1 is as small as possible, for example, to satisfy the minimum size of the Design Rule between the routing lines in the manufacturing process of the display substrate 10, so as to ensure the yield. The design rule relates to the process capability of the device, the etching process of the third conductive layer 503, the thickness of the third conductive layer 503, or the like. For example, the range of the minimum value of the size L3 is 0.5 μm to 6 μm, for example 2 μm to 3 μm, 3 μm to 4 μm, for example 3.5 μm. This arrangement may maximize the area of the third capacitor electrode Cc, thereby contributing to an increase in the capacitance of the storage capacitor Cst.

Referring to FIGS. 6B, 8A and 8B, the active layer T3a of the third transistor T3 includes a body region 700 and a first via hole region 701 which are arranged in the first direction D1 successively and electrically connected to each other. The body region 700 includes a channel region T3a0 of the third transistor T3 and a second electrode contact region T3a2 on a side of the channel region T3a0 away from the first via hole region 701, and the channel length direction of the channel region is the first direction D1. The first electrode T3s of the third transistor T3 is electrically connected to the first via hole region 701 through the via hole 401.

As shown in FIG. 8A, the first via hole region 701 is shifted in the second direction D2 with respect to the body region 700, so that the active layer T3a of the third transistor T3 includes a first active layer side 710 connecting the body region 700 and the first via hole region 701, the extension direction of the first active layer side 710 intersecting with both the first direction D1 and the second direction D2. A center line of the body region 700 in the first direction D1 is not coincident with a center line CL4 of the first via hole region 701 in the first direction D1. For example, the first via hole region 701 is a part or all of the first electrode contact region T3a1 of the third transistor T3. For example, the first via hole region 701 is a region of the first electrode contact region T3a1 contacting the first electrode T3s of the third transistor T3.

For example, the center line of the body region 700 in the first direction D1 coincides with the center line CL1 of the sub-pixel in the first direction D1, so that the body region is disposed corresponding to the concave structure of the second scan line 460, which helps to improve the space utilization within the sub-pixel.

As shown in FIG. 8A, the first electrode T3s of the third transistor T3 is electrically connected to the second capacitor electrode Cb through the via hole 403. The center line CL3 of the first via hole region 701 in the first direction D1 is located on a side of the center line CL1 of the sub-pixel in the first direction D1 away from the via hole 403. For example, the via holes 403 and 401 are on two sides of the center line CL1 respectively. For example, the via holes 403 and 401 are symmetrically disposed with respect to the center line CL1.

Since the via hole 401 and the via hole 403 are arranged side by side in the second direction D2, the arrangement of the via hole 401 and the via hole 403 on both sides of the center line CL1 of the sub-pixel in the first direction D1 contributes to improving the space utilization and thus the pixel density. Therefore, the first electrode contact region T3a1 of the third transistor T3 and the second electrode contact region T3a2 may not be symmetrically disposed with respect to the channel region T3a0, but are shifted in the second direction D2 to form the first via hole region 701.

As shown in FIG. 8A, the offset causes a steep slope of the active layer T3a of the third transistor T3 at the junction of the first via hole region 701 and the body region 700, causing a width of the channel through which current flows to narrow down, thereby forming a region where a sudden change (increase) may occur to the resistance. For example, the body region 700 and the first via hole region 701 are both rectangular, and a corner θ1 where the first via hole region 701 is connected with the body region 700 is approximately 90 degrees. Referring to FIG. 1B, for example, in the reset phase of the pixel circuit operation, the first switch K1 is turned off, the analog-to-digital converter writes a reset signal to the first electrode of the light emitting element (e.g., the anode of the OLED) through the first detection line and the third transistor T3, and in this situation, the current flows from the first electrode of the light emitting element to the first via hole region 701 of the active layer of the third transistor T3, and then flows from the first via hole region 701 to the body region 700 and then flows into the detection line segment 131 to reach the external detection circuit. The moving direction of the charges (electrons in this embodiment) are shown in FIG. 8A, and the channel width is narrowed when the charge passes through the corner of the active layer, which affects the reset voltage at the node S and thus the final display gray scale. For another example, in the detection phase of the pixel circuit operation, the current also flows from the anode of the light emitting element to the detection line segment 131, and the sudden resistance change affects the accuracy of the detected electrical characteristics of the sub-pixel, thereby affecting the accuracy of the compensation signal, and finally also affects the precision of the light emitting current of the light emitting element, thereby affecting the precision of the display screen. For example, the first electrode contact region T3a1 of the third transistor T3 is made of a conductive material obtained by conducting a semiconductor material, and the resistance is relatively large; for example, in the case where the active layer is made of metal oxide semiconductor (e.g., IGZO), a square resistance after the metal oxide semiconductor is conducted reaches an order of kilo-ohm, which causes more serious influence of the sudden resistance change at the connection corner between the body region 700 and the first via hole region 701 on the current.

In the display substrate according to at least one embodiment of the present disclosure, the active layer T3a of the third transistor T3 further includes a first active layer side 710 connecting the body region 700 and the first via hole region 701, the first active layer side 710 may be a straight line or a curved line (e.g., a protruding circular arc), and the extension direction of the first active layer side 710 intersects with both the first direction D1 and the second direction D2, i.e., neither parallel with nor perpendicular to the channel length (L) direction of the third transistor T3. In the example shown in FIG. 8A, the first active layer side 710 is taken as a straight line for example, thereby allowing the slope between the body region 700 and the first via hole region 701 to gradually decrease, as shown in FIG. 8A, the corner angle increases to an obtuse angle θ2 from θ1; wherein the corner angle θ2 is the angle between the first active layer side 710 and the side of the first via hole region 701 that is connected to the first active layer side 710. Therefore, the first active layer side 710 widens the channel width of the active layer T3a at the junction, alleviates sudden resistance change at the junction, and improves the precision of the pixel circuit compensation signal and the light emitting current of the light emitting element, thereby improving the precision of the display screen. For example, as shown in FIG. 8A, the minimum channel width W' corresponding to the first active layer side 710 is the same as the channel region width W of the third transistor T3.

As shown in FIG. 8A, the active layer T3a of the third transistor T3 further includes a first complementary angle region 703 corresponding to the side 701, and the first complementary angle region 703 includes the first active layer side 710. The first complementary angle region 703 is formed by extended the body region 700 toward the first via hole region 701. For example, the first complementary angle region 703 is triangular, filled at the corner, and is integrated with the body region 700 and the first via hole region 701; the first active layer side 710 is linear. However, the shapes of the first complementary angle region 703 and the first active layer side 710 are not limited in the embodiments of the present disclosure.

For example, as shown in FIG. 8A, the first electrode T3s of the third transistor T3 is electrically connected to the first via hole region 701 through the via hole 401, and is electrically connected to the second capacitor electrode Cb through the via hole 403. The first complementary angle region 703 may be made as large as possible to widen the channel width as much as possible on the premise of ensuring the manufacturing yield of the via hole.

For example, as shown in FIG. 8A, the active layer T3a0 of the third transistor T3 has a minimum distance L0 from the via hole 403 at the side 710. For example, the minimum distance L0 is the minimum size that satisfies the design rule between the via hole and the routing line in the manufacturing process of the display substrate 10, so as to ensure the yield of the via hole and the routing line. The design rules relate to the process capability of the device, the process of fabricating the via hole, the depth of the via hole, the thickness of the semiconductor layer 504, or the like. For example, the minimum pitch L0 between the via hole 403 and the orthographic projection of the first active layer side 710 on the base substrate 101 is 0.5 μm to 6 μm, for example 2 μm to 3 μm, 3 μm to 4 μm, for example 3.5 μm.

For example, as shown in FIG. 8A, in the first direction D1, the via hole 403 is overlapped with the first complementary angle region 703 and is not overlapped with the first via hole region 701.

For example, as shown in FIG. 8A, the first complementary angle region 703 and the first via hole region 701 are located on both sides of the center line of the channel region of the third transistor T3 in the first direction D1 respectively. For example, as shown in FIG. 8A, the via hole 403 is located on a side of the side 401 away from the center line of the channel region of the third transistor in the first direction D1.

As shown in FIG. 8A, the body region 700 further includes a second via hole region 702 located on a side of the channel region T3a0 away from the first via hole region 701 in the first direction D1, and the second via hole region 702 is electrically connected to the second electrode T3s of the third transistor T3 through the via hole 206. For example, the second via hole region 702 may be a part or all of the second electrode contact region T3a2 of the third transistor T3.

For example, referring to FIGS. 8A and 8B, the detection line segment 131 and the second capacitor electrode Cb are in the same layer and insulated from each other, the second electrode T3s of the third transistor T3 is electrically connected to the detection line segment 131 through the via hole 202 to be connected to an external detection circuit, and the via hole 202 is located on a side of the via hole 206 away from the channel region T3a0.

For example, when the substrate space allows, the active layer T3a of the third transistor T3 may further include a second complementary angle region 704 located at another corner where the body region 700 is connected to the first via hole region 701, opposite to the first complementary angle region 703.

Figure 9A:
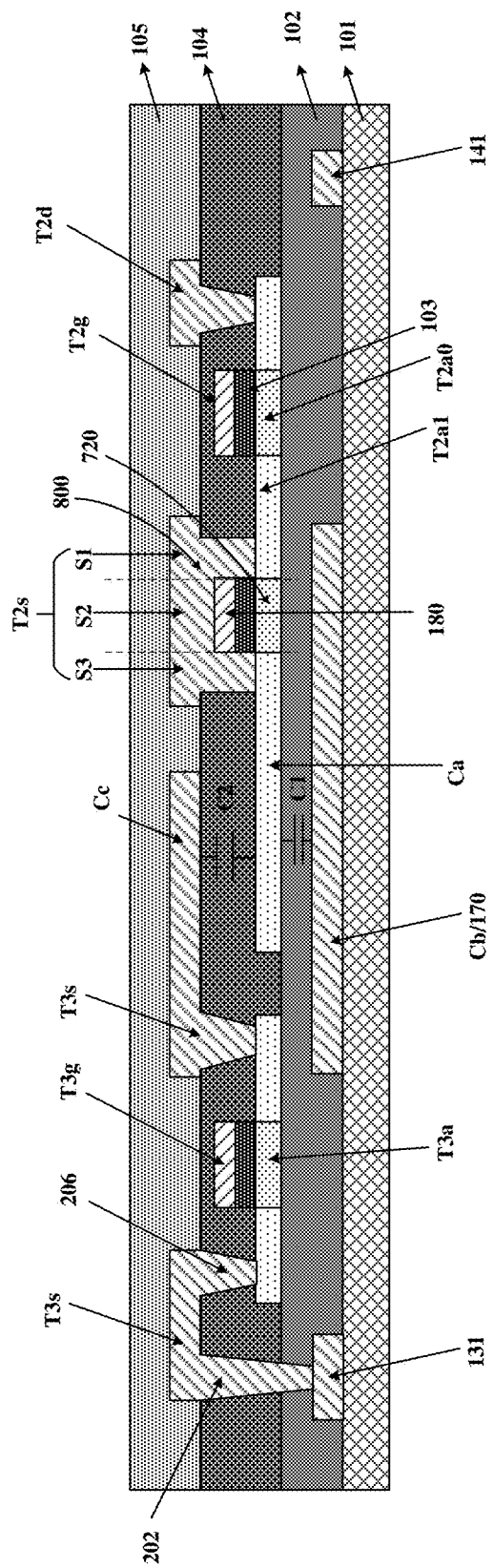
FIG. 9A is a sectional view of FIG. 7 along section line C-C'.
Figure 9B:
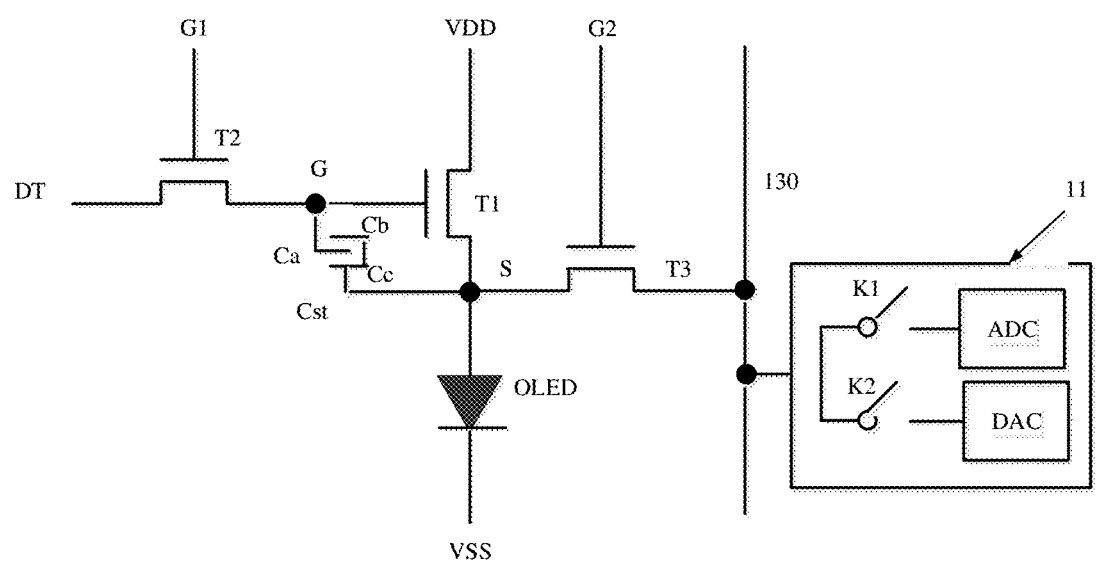
FIG. 9B is a second diagram of a pixel circuit in a display substrate according to at least one embodiment of the present disclosure.

FIG. 9A shows a sectional view of FIG. 7 along section line C-C'. Referring to FIGS. 7, 8B and 9A (also referring to FIGS. 11A and 11B together), the first capacitor electrode Ca and the second capacitor electrode Cb are facing each other to form a first capacitor C1, the first capacitor electrode Ca and the third capacitor electrode Cc are facing each other to form a second capacitor electrode C2, and the second capacitor electrode Cb and the third capacitor electrode Cc are electrically connected through a via hole 403, that is, the storage capacitor Cst includes the first capacitor C1 and the second capacitor C2 which are connected in parallel, so that the capacitance of the storage capacitor Cst is increased. FIG. 9B shows a pixel circuit diagram corresponding to the display substrate shown in FIG. 9A.

Referring to FIGS. 7 and 9A, the first electrode T2s of the second transistor T2 is electrically connected to the first electrode contact region Ta1 of the second transistor T2, the extension portion 180 (i.e., the gate electrode T1g of the first transistor T1) and the first capacitor electrode Ca through a via hole 800 (an example of a third via hole of the embodiment of the present disclosure). The first electrode T2s of the second transistor T2 is electrically connected to the three parts through one via hole, which may reduce the occupied layout space and increase the wiring density, compared with the case where the first electrode T2s is electrically connected with the three parts through plural via holes respectively, thereby increasing the pixel density.

Referring to FIGS. 7 and 9A, the first electrode T2s of the second transistor T2 extends in the first direction D1, crosses the extension portion 180 (intersects with the extension portion 180), and is electrically connected with the first capacitor electrode Ca through the via hole 800. For example, the via hole 800 extends in the first direction D1 and exposes a surface of the extension portion 180 and at least portions of two side surfaces of the extension portion 180 opposite in the first direction D1. The first electrode T2s of the second transistor T2 includes a first portion S1, a second portion S2, and a third portion S3, the second portion S2 overlaps with the extension portion 180, and the first portion S1 and the third portion S3 are respectively on both sides of the second portion S2 in the first direction D1. For example, through the via hole 800, the first portion S1 is electrically connected to the first electrode contact region T2a1 of the active layer T2a of the second transistor T2, and the second portion S2 is electrically connected with the extension portion 180 by direct contact, which helps to increase the contact area and reduce the resistance; the third portion S3 is electrically connected to the first capacitor electrode Ca.

For example, referring to FIGS. 7 and 9A, the first electrode T2s of the second transistor T2 extends in the first direction, and clads the two side surfaces of the extension portion through the via hole 800, so that the first electrode T2s of the second transistor T2 has a larger contact area with the extension portion 180, thereby reducing the contact resistance of the first electrode T2s and the extension portion 180.

For example, referring to FIGS. 6B and 9A, the display substrate 20 may further include a connection portion 720 overlapping with the extension portion 180 in the direction perpendicular to the base substrate 101 and the connection portion 720 is in the same layer as the first capacitor electrode Ca. The connection portion 720 connects the first capacitor electrode Ca and the first electrode contact region T2a1 of the second transistor T2 into an integrated structure. The connection portion 720 is not conducted because it is shielded by the extension portion 180. When the second transistor T2 is turned on to transmit a data signal from the second electrode T2d of the second transistor T2 to the first electrode T2s thereof and the gate T1g of the first transistor T1, the connection portion 720 is turned on by the data signal in the extension portion 180 and the first electrode T2s of the second transistor T2 above the connection portion, so that the first electrode T2s of the second transistor T2 is electrically connected to the first capacitor electrode Ca. In this way, a dual channel structure is formed between the first electrode T2s of the second transistor T2 and the first capacitor electrode Ca, which helps to reduce the channel resistance.

In addition, the first capacitor electrode Ca is connected with the first electrode contact region T2a1 of the second transistor T2 into an integrated structure (refer to FIG. 6B) by the connection portion, so that the first electrode contact region T2a1 of the second transistor T2 is also included in the range of the first capacitor electrode Ca, which enables the first capacitor electrode Ca to have a large area and a large overlapping area with the second capacitor electrode Cb, thereby increasing the capacitance of the storage capacitor Cst.

For example, as shown in FIGS. 7 and 9A, the second capacitor electrode Cb may be at least partially overlapped with the first electrode contact region T2a1 of the second transistor T2 in the direction perpendicular to the base substrate to have a larger overlapping area with the first capacitor electrode, so as to increase the capacitance of the storage capacitor Cst. For example, the second capacitor electrode Cb is not overlapped with the channel region T2a0 of the second transistor T2 in the direction perpendicular to the base substrate 101, so as to avoid the adverse effect of the potential of the second capacitor electrode Cb on the operation of the second transistor T2, for example, avoiding the problems that the second transistor T2 may not be normally turned off, the leakage current is large, or the like, due to the potential of the second capacitor electrode Cb acting on the channel region T2a0 of the second transistor T2.

With the development of high-resolution display products, the pixel density of the display substrate is improved, and the structure in the display substrate is greatly restricted by space. For example, the storage capacitor Cst is limited by space, the capacitance may not be easily increased, and the overlapping area of the capacitive electrodes directly affects the capacitance. Due to the influence of the alignment between layers of the process equipment and the etching fluctuation (also referred to as CD Bias), the uniformity of the capacitance of the storage capacitor between pixels is poor.

Figure 10:
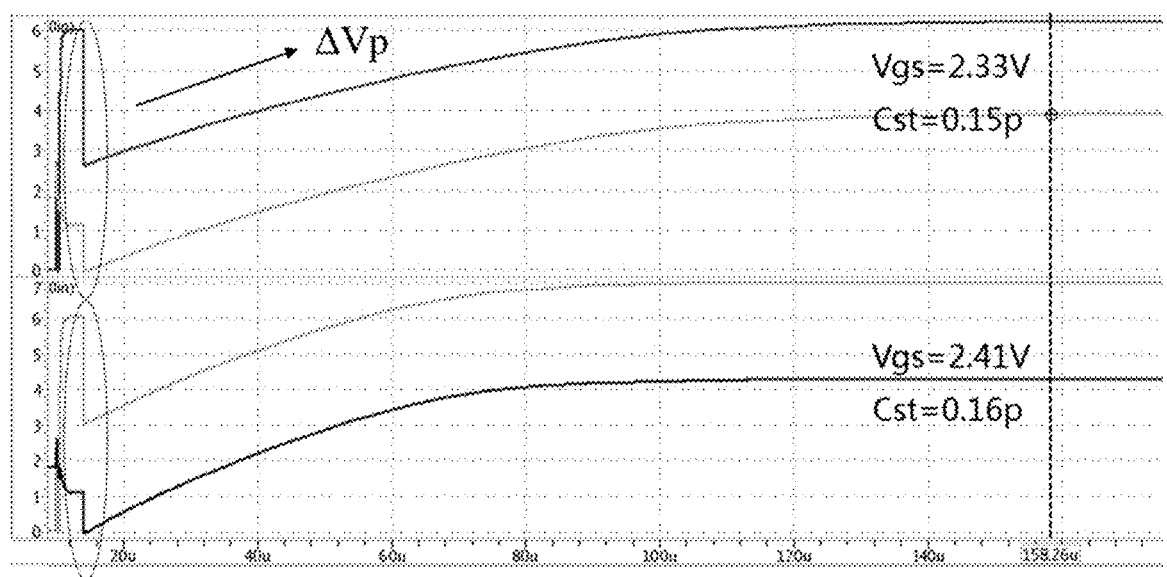
FIG. 10 illustrates the influence of fluctuation of a storage capacitor on a display gray scale.

FIG. 10 schematically shows the influence of the storage capacitor Cst on the sub-pixel. Referring to FIG. 1B, after the data signal DT is written into the gate node G of the first transistor T1 by the second transistor T2, in the process of the first control signal G1 changing from high level to low level, a change value of the first control signal G1 is $\Delta U$. Since a capacitor Cgs exists between the gate and the first electrode of the second transistor T2, the capacitor Cgs is connected in series with the storage capacitor Cst, and a coupling effect occurs, the variation $\Delta Vp$ of the pulled-down voltage at the gate node G of the first transistor T1 is: $\Delta Vp$ (Cgs×$\Delta U$)/(Cgs+Cst).

In the case where the process is determined, Cgs is a fixed value, and the size and uniformity of the storage capacitor Cst may influence $\Delta Vp$, so as to influence the display image quality; that is, the difference in storage capacitor Cst among different sub-pixels may cause a moire (Mura) failure in the display image quality. As shown in FIG. 10, under the same conditions, the storage capacitor Cst changes from 0.15 pF to 0.16 pF, the data signal DT changes by 0.08V, and if a 10-bit driving is adopted, a variation of about 5 gray levels is caused, resulting in moire of the display image quality.

In the display substrate 10 according to some embodiments of the present disclosure, a range of the orthogonal projection of the first capacitor electrode Ca of the storage capacitor Cst on the base substrate 101 is within a range of the orthogonal projection of the second capacitor electrode Cb on the base substrate 101. It should be noted that "the projection range of A is within the projection range of B" in the present disclosure does not include the case where the edges of A and B are partially or completely overlapped.

By designing the capacitor electrode of the storage capacitor Cst to indent at different layers, the display substrate according to at least one embodiment of the present disclosure may improve the consistency and stability of the capacitances of the storage capacitors Cst in different sub-pixels, solve the problem of non-uniform capacitance due to alignment and etching fluctuation, and finally improve the display uniformity of a high-resolution (PPI) display product.

Figure 11A:
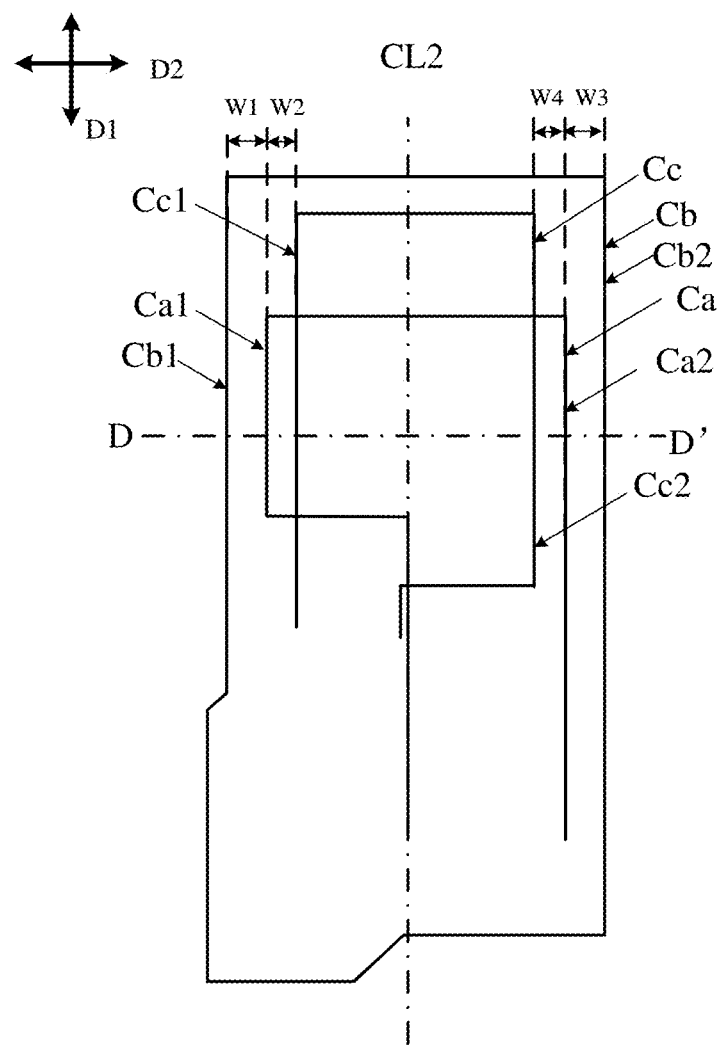
FIG. 11A is a seventh schematic diagram of a display substrate according to at least one embodiment of the present disclosure.
Figure 11B:
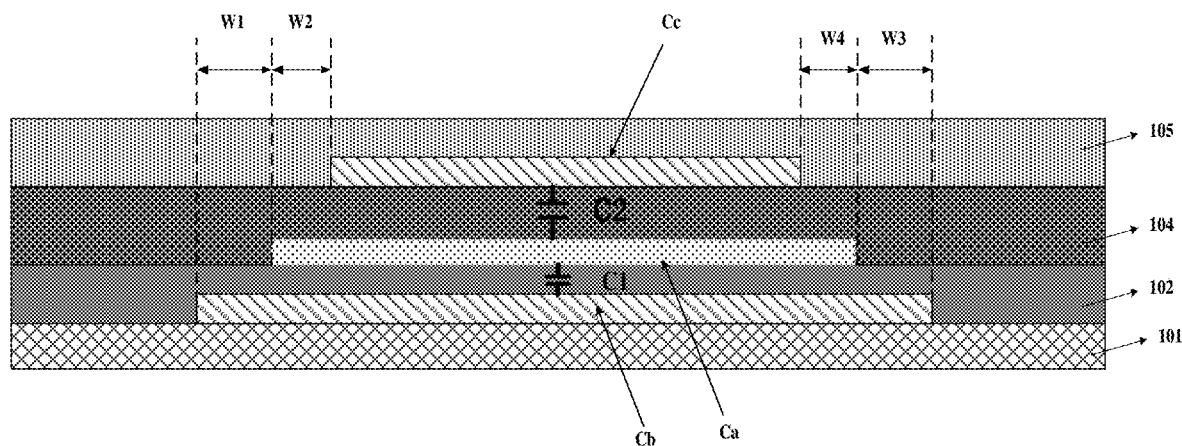
FIG. 11B is a sectional view of FIG. 11A along section line D-D'.

FIG. 11A is a partially schematic enlarged diagram of a storage capacitor Cst in the display substrate according to an embodiment of the present disclosure, schematically illustrating a boundary of each capacitor electrode of the storage capacitor Cst in the second direction D2. FIG. 11B shows a sectional view of FIG. 11A along section line D-D'.

As shown in FIG. 11A, the first capacitor electrode Ca has a first capacitor electrode side Ca1 and a second capacitor electrode side Ca2 opposite to each other in the second direction D2. The second capacitor electrode Cb has a third capacitor electrode side Cb1 and a fourth capacitor electrode side Cb2 opposite to each other in the second direction D2. The third capacitor electrode Cc has a fifth capacitor electrode side Cc1 and a sixth capacitor electrode side Cc2 opposite to each other in the second direction D2. The first capacitor electrode side Ca1, the third capacitor electrode side Cb1 and the fifth capacitor electrode side Cc1 are located on the same side of the sub-pixel, i.e., a first side (left side in FIG. 11A), and the second capacitor electrode side Ca2, the fourth capacitor electrode side Cb2 and the sixth capacitor electrode side Cc2 are located on a second side (right side in FIG. 11A) of the sub-pixel opposite to the first side.

For example, the first capacitor electrode side Ca1, the second capacitor electrode side Ca2, the third capacitor electrode side Cb1, the fourth capacitor electrode side Cb2, the fifth capacitor electrode side Cc1 and the sixth capacitor electrode side Cc2 are all substantially extended along the first direction, and may be of a linear structure, or a curve structure such as a bent-line structure or a wavy structure or the like.

As shown in FIGS. 11A and 11B, both an orthographic projection of the first capacitor electrode side Ca1 on the base substrate 101 and orthographic projection of the second capacitor electrode side Ca2 on the base substrate 101 are between the orthographic projection of the third capacitor electrode side Cb1 on the base substrate 101 and the orthographic projection of the fourth capacitor electrode side Cb2 on the base substrate 101.

It should be noted that in the above case, all of the orthographic projections of the first capacitor electrode side Ca1 and the second capacitor electrode side Ca2 on the base substrate 101 are between the orthographic projection of the third capacitor electrode side Cb1 on the base substrate 101 and the orthographic projection of the fourth capacitor electrode side Cb2 on the base substrate 101, which excludes the case that orthographic projection of the first capacitor electrode side Ca1 or the second capacitor electrode side Ca2 overlaps or intersects the orthographic projection of the third capacitor electrode side Cb1 or the fourth capacitor electrode side Cb2.

Because the range of the orthographic projection of the first capacitor electrode Ca in the second direction is within the range of the orthographic projection of the second capacitor electrode Cb (the capacitor electrode in a lower layer) and a margin is reserved, therefore, even if there is misalignment or etching deviation when the capacitor electrode is formed, it may be ensured that the capacitor electrode and the adjacent lower capacitor electrode have a large overlapping area, which may alleviate the problem of non-uniform capacitance due to the influence of misalignment and etching fluctuation, and finally improve the display uniformity of the high resolution (PPI) display product.

For example, in the second direction D2, the range of the orthographic projection of the third capacitor electrode Cc on the base substrate is within the rage of the orthographic projection of the first capacitor electrode Ca on the base substrate 101.

As shown in FIGS. 11A and 11B, both an orthographic projection of the fifth capacitor electrode side Cc1 on the base substrate 101 and the orthographic projection of the sixth capacitor electrode side Cc2 on the base substrate 101 are between the orthographic projection of the first capacitor electrode side Ca1 on the base substrate 101 and the orthographic projection of the second capacitor electrode side Ca2 on the base substrate 101.

As shown in FIGS. 11A and 11B, an orthographic projection of the first capacitor electrode side Ca1 on the base substrate 101 is located at an inner side of the orthographic projection of the third capacitor electrode side Cb1 on the base substrate 101, i.e., the side close to the center line CL2 of the second capacitor electrode Cb in the first direction D1; an orthographic projection of the second capacitor electrode side Ca2 on the base substrate 101 is located at an inner side of an orthographic projection of the fourth capacitor electrode side Cb2 on the base substrate 101, i.e., the side close to the center line CL2 of the second capacitor electrode Cb in the first direction D1.

An orthographic projection of the fifth capacitor electrode side Cc1 on the base substrate 101 is located at an inner side of an orthographic projection of the first capacitor electrode side Ca1 on the base substrate 101, i.e., the side away from the third capacitor electrode side Cb1; an orthographic projection of the sixth capacitor electrode side Cc2 on the base substrate 101 is located at an inner side of an orthographic projection of the second capacitor electrode side Ca2 on the base substrate 101, i.e., the side away from the fourth capacitor electrode side Cb2.

Since the projection range of each capacitor electrode in the second direction D2 is within the projection range of the adjacent lower capacitor electrode in the second direction and a certain margin is left, even if there is misalignment or etching deviation when the capacitor electrode is formed, it may be ensured that the capacitor electrode and the adjacent lower capacitor electrode have a large overlapping area, which may alleviate the problem of non-uniform capacitance due to the influence of misalignment and etching fluctuation, and finally improve the display uniformity of the high resolution (PPI) display product.

As shown in FIGS. 11A and 11B, a pitch W1 is present between the orthographic projection of the first capacitor electrode side Ca1 on the base substrate 101 and the projection of the third capacitor electrode side Cb1 on the base substrate 101, and a pitch W3 is present between the orthographic projection of the second capacitor electrode side Ca2 on the base substrate 101 and the orthographic projection of the fourth capacitor electrode side Cb2 on the base substrate 101; a pitch W2 is present between the orthographic projection of the fifth capacitor electrode side Cc1 on the base substrate 101 and the projection of the first capacitor electrode side Ca1 on the base substrate 101, and a pitch W4 is present between the orthographic projection of the sixth capacitor electrode side Cc2 on the base substrate 101 and the orthographic projection of the second capacitor electrode side Ca2 on the base substrate 101. For example, for an irregular capacitor electrode pattern, the above-mentioned pitch is the minimum pitch.

Figures 11C, 12:
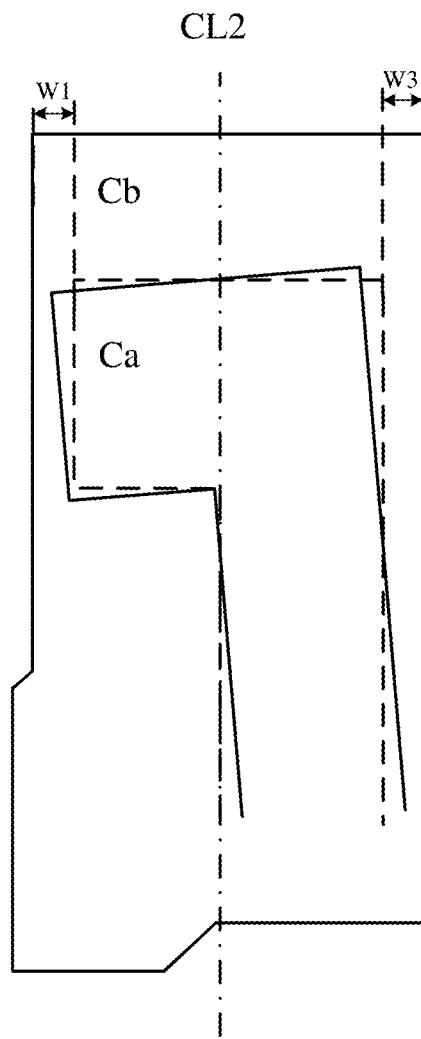
FIG. 11C illustrates misalignment of a first capacitor electrode.
FIG. 12 is a schematic diagram of a display panel according to at least one embodiment of the present disclosure.

For example, the center line of the orthographic projection of the first capacitor electrode Ca on the base substrate 101 in the first direction D1, the center line of the orthographic projection of the second capacitor electrode Cb on the base substrate 101 in the first direction D1, and the center line of the orthographic projection of the third capacitor electrode Cc on the base substrate 101 in the first direction D1 coincide with one another; that is, W1=W3, W2=W4. Since the above-mentioned alignment and etching deviations are usually symmetrical (as shown in FIG. 11C), such an arrangement may effectively improve the space utilization rate.

Errors typically occur when each material layer is patterned to form a pattern. For example, in the photolithography process, alignment errors easily occur in the exposure phase; in the etching process, an actual size of the pattern obtained by etching is less than a design value, leading to a difference (i.e., "CD bias") between the design value and the actual value. Therefore, in actual design, the above-mentioned pitches W1 and W2 are required to be designed in consideration of the above-mentioned factors.

For example, the pitch W1 satisfies: W1≥a1+(b1−b2)/2; wherein a1 is an alignment error (absolute value) of the first capacitor electrode Ca to the second capacitor electrode Cb in the second direction D2, b1 is a difference (also referred to as CD bias) (absolute value) between the design value and the actual value of the second capacitor electrode Cb in the second direction D2, and b2 is a difference (absolute value) between the design value and the actual value of the first capacitor electrode Ca in the second direction D2.

For example, the pitch W2 satisfies: W2≥a2+(b2−b3)/2; wherein a2 is an alignment error (absolute value) of the third capacitor electrode Cc to the first capacitor electrode Ca in the second direction D2, b2 is a difference (absolute value) between the design value and the actual value of the first capacitor electrode Ca in the second direction D2, and b3 is a difference (absolute value) between the design value and the actual value of the third capacitor electrode Cc in the second direction D2.

With such an arrangement, in the case where the above-mentioned alignment error and etching fluctuation occur, the projection range of the first capacitor electrode Ca in the second direction D2 still falls within the projection range of the second capacitor electrode Cb in the second direction, and the projection range of the third capacitor electrode Cc in the second direction D2 still falls within the projection range of the first capacitor electrode Ca in the second direction, so that the capacitance change of the storage capacitor Cst in each sub-pixel due to the process fluctuation may be avoided, and the stability and the consistency of the capacitance of the storage capacitor Cst are improved, thereby improving the display uniformity.

For example, FIG. 11C shows an alignment error when the first capacitor electrode Ca is formed, and the projection range of the first capacitor electrode Ca in the second direction D2 still falls within the projection range of the second capacitor electrode Cb in the second direction, so that the overlapping area between the first capacitor electrode Ca and the second capacitor electrode Cb is less affected, and the stability and uniformity of the capacitance of the storage capacitor Cst are improved.

At least one embodiment of the present disclosure further provides a display panel including any one of the above-mentioned display substrates 10. It should be noted that, referring to FIG. 8B, the above-mentioned display substrate 10 according to at least one embodiment of the present disclosure may include the light emitting element 125, or may not include the light emitting element 125; that is, the light emitting element 125 may be formed in a panel factory after the display substrate 10 is completed. In the case where the display substrate 10 itself does not include the light emitting element 125, the display panel according to the embodiment of the present disclosure further includes the light emitting element 125 in addition to the display substrate 10.

For example, the display panel is an OLED display panel, and correspondingly, the display substrate 10 included therein is an OLED display substrate. As shown in FIG. 12, for example, the display panel 20 further includes an encapsulation layer 801 and a cover plate 802 disposed on the display substrate 10, and the encapsulation layer 801 is configured to seal the light emitting element on the display substrate 10 to prevent damages to the light emitting element and the drive circuit due to penetration of external moisture and oxygen. For example, the encapsulation layer 801 includes an organic thin film or a structure in which an organic thin film and an inorganic thin film are alternately stacked. For example, a water absorption layer (not shown) may be further disposed between the encapsulation layer 801 and the display substrate 10, configured to absorb water vapor or sol remaining in the light emitting element during the previous manufacturing process. The cover plate 802 is, for example, a glass cover plate. For example, the cover plate 802 and the encapsulation layer 801 may be integrated with each other.

Figure 13:
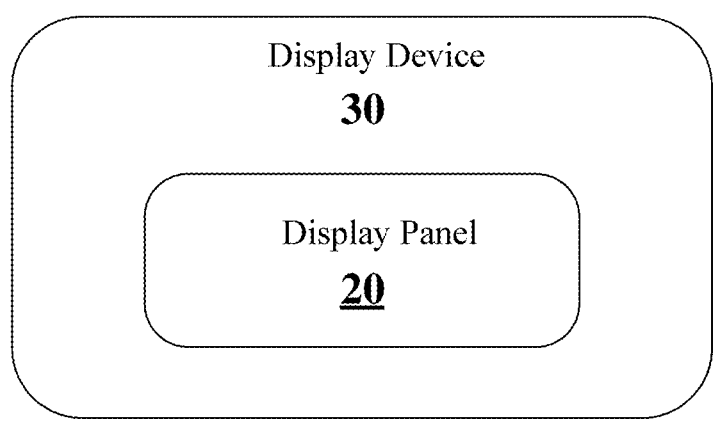
FIG. 13 is a schematic diagram of a display device according to at least one embodiment of the present disclosure.

At least one embodiment of the present disclosure further provides a display device 30. As shown in FIG. 13, the display device 30 includes any one of the above-mentioned display substrate 10 or display panel 20, and the display device in this embodiment may be any product or component with a display function, such as a display, an OLED panel, an OLED television, electronic paper, a mobile phone, a tablet computer, a notebook computer, a digital photo frame, a navigator or the like.

At least one embodiment of the present disclosure further provides a manufacturing method of the above-mentioned display substrate. The method for manufacturing a display substrate according to an embodiment of the present disclosure will be exemplarily described below with reference to FIGS. 2A, 6A to 6D, but the embodiment of the present disclosure is not limited thereto.

The manufacturing method includes the following steps S61-S65.

Step S61: forming a first conducting material layer and performing a patterning process on the first conducting material layer to form a first conductive layer 501 as shown in FIG. 6A, i.e., to form a detection line segment 131, a power line segment 141, and a second capacitor electrode Cb of the storage capacitor Cst, which are insulated from one another.

Step S62: forming a first insulating layer 102 on the first conductive layer 501 and forming a semiconductor material layer on the first insulating layer, the semiconductor material layer being subjected to a patterning process to form a semiconductor layer 504 as shown in FIG. 6B, i.e., to form an active layer T1a of the first transistor T1, an active layer T2a of the second transistor T2, and an active layer T3a of the third transistor T3 which are spaced apart from one another.

Step S63: forming a second insulating layer 103 on the semiconductor layer 504 and forming a second conducting material layer on the second insulating layer, the second conducting material layer being patterned to form a second conductive layer 502 as shown in FIG. 6C, i.e., to form a gate T1g of the first transistor T1, a gate T2g of the second transistor T2, and a gate T3g of the third transistor T3, which are insulated from one another.

For example, as shown in FIG. 6C, the second conductive layer 502 further includes a first scan line 150 and a second scan line 160 insulated from each other.

For example, the first scan line 150 is integrated with the gate T2g of the second transistor T2 of one corresponding row of sub-pixels, and the second scan line 160 is integrated with the gate T3g of the third transistor T3 of one corresponding row of sub-pixels.

Step S64: conducting (for example, doping) the semiconductor layer 504 by using the second conductive layer 502 as a mask through a self-alignment process, so that the portion of the semiconductor layer 504 not covered by the second conductive layer 502 is conducted, thereby obtaining the first capacitor electrode Ca, and the portions of the active layer of each transistor on both sides of the channel region are conducted to form a first electrode contact region and a second electrode contact region respectively, which are configured to be electrically connected to the first electrode and the second electrode of the transistor respectively. FIG. 6B shows the first and second electrode contact regions T1a1 and T1a2 of the active layer T1a of the first transistor T1, the first and second electrode contact regions T2a1 and T2a2 of the active layer T2a of the second transistor T2, and the first and second electrode contact regions T3a1 and T3a2 of the active layer T3a of the third transistor T3.

For example, before the semiconductor layer 204 is conducted, an etching process is performed on the second insulating layer 103, so that the region of the second insulating layer 103 not covered by the second conductive layer 502 is completely etched, that is, the second insulating layer 103 and the second conductive layer 502 coincide in the direction perpendicular to the base substrate 101. In this way, when the region of the semiconductor layer 504 not covered with the second conductive layer 502 is conducted by ion implantation, the implanted ions may not be blocked by the second insulating layer 103.

Step S65: forming a third insulating layer 104 on the second conductive layer 502, and forming a third conducting material layer on the third insulating layer 104, and performing a patterning process on the third conducting material layer to form a third conductive layer 503 as shown in FIG. 6D, i.e., to form a first electrode T1s and a second electrode T1d of the first transistor T1, a first electrode T2s and a second electrode T2d of the second transistor T2, and a first electrode T3s and a second electrode T3d of the third transistor T3.

For example, the second conductive layer further includes a data line 110, an auxiliary electrode line 120, a first detection line 130, and a first power line 140 insulated from one another.

For example, as shown in FIG. 6D, the first power line 140 is integrated with the second electrode T1d of the first transistor T1 in the (nearest) sub-pixel directly adjacent thereto. For example, each data line 110 is integrated with the second electrode T2d of the second transistor T2 in the sub-pixel connected thereto.

This forms a structure of the sub-pixel shown in FIG. 2A.

For example, the material of the semiconductor material layer includes, but not limited to, silicon-based materials (amorphous silicon a-Si, polysilicon p-Si, etc.), metal oxide semiconductors (IGZO, ZnO, AZO, IZTO, etc.), and organic materials (hexathiophene, polythiophene, etc.).

For example, the material of the above-mentioned first conducting material layer, second conducting material layer, and third conducting material layer may include gold (Au), silver (Ag), copper (Cu), aluminum (Al), molybdenum (Mo), magnesium (Mg), tungsten (W), and an alloy material formed by combining the above metals; or a conductive metal oxide material such as Indium Tin Oxide (ITO), Indium Zinc Oxide (IZO), zinc oxide (ZnO), zinc aluminum oxide (AZO), etc.

For example, the first insulating layer 102, the second insulating layer 103, and the third insulating layer 104 are inorganic insulating layers, for example, oxide of silicon, nitride of silicon or oxynitride of silicon, such as silicon oxide, silicon nitride, silicon oxynitride, or an insulating material including a metal oxynitride, such as aluminum oxide, titanium nitride, or the like. For example, the insulating layers may also be made of organic materials, such as Polyimide (PI), acrylate, epoxy, polymethyl methacrylate (PMMA), or the like. The embodiments of the present disclosure are not limited thereto.

For example, the above-mentioned patterning process may include a conventional photolithography process, including, for example, coating, exposing, developing, baking, etching, or the like of a photoresist.

What have been described above are only specific implementations of the present disclosure, the protection scope of the present disclosure is not limited thereto. The protection scope of the present disclosure should be based on the protection scope of the claims.

What is claimed is:

1. A display substrate, comprising:
a base substrate, and
a plurality of sub-pixels on the base substrate,
wherein the plurality of sub-pixels are arranged in a sub-pixel array in a first direction and a second direction, the first direction intersecting with the second direction,
at least one of the plurality of sub-pixels comprises a first transistor, a second transistor, a third transistor, and a storage capacitor on the base substrate,
the storage capacitor comprises a first capacitor electrode, a second capacitor electrode and a third capacitor electrode, and the second capacitor electrode is electrically connected with the third capacitor electrode;
a first electrode of the second transistor is electrically connected to the first capacitor electrode of the storage capacitor and a gate electrode of the first transistor, a second electrode of the second transistor is configured to receive a data signal, a gate electrode of the second transistor is configured to receive a first control signal, and the second transistor is configured to write the data signal to the gate electrode of the first transistor and the storage capacitor in response to the first control signal,
a first electrode of the first transistor is electrically connected to a second capacitor electrode of the storage capacitor and configured to be electrically connected to a light emitting element, a second electrode of the first transistor is configured to receive a first power voltage, and the first transistor is configured to control a current for driving the light emitting element under control of a voltage of the gate electrode of the first transistor,
a first electrode of the third transistor is electrically connected with the first electrode of the first transistor and a second capacitor electrode of the storage capacitor, a second electrode of the third transistor is configured to be connected with a detection circuit, a gate electrode of the third transistor is configured to receive a second control signal, and the third transistor is configured to detect an electrical characteristic of the sub-pixel to which the third transistor belongs by the detection circuit in response to the second control signal;

the second capacitor electrode is on a side of the first capacitor electrode close to the base substrate, the third capacitor electrode is on a side of the first capacitor electrode away from the base substrate, and the first capacitor electrode is at least partially overlapped with the second capacitor electrode and the third capacitor electrode in a direction perpendicular to the base substrate;

the first capacitor electrode has a first capacitor electrode side and a second capacitor electrode side opposite to each other in the second direction, and the second capacitor electrode has a third capacitor electrode side and a fourth capacitor electrode side opposite to each other in the second direction;

an orthographic projection of the first capacitor electrode side on the base substrate and an orthographic projection of the second capacitor electrode side on the base substrate are between an orthographic projection of the third capacitor electrode side on the base substrate and an orthographic projection of the fourth capacitor electrode side on the base substrate;

the second capacitor electrode is on a side of an active layer of the first transistor close to the base substrate, and an orthographic projection of the active layer of the first transistor on the base substrate is covered by an orthographic projection of the second capacitor electrode on the base substrate.

2. A display substrate, comprising:

a base substrate, and a plurality of sub-pixels on the base substrate, wherein the plurality of sub-pixels are arranged in a sub-pixel array in a first direction and a second direction, the first direction intersecting with the second direction, at least one of the plurality of sub-pixels comprises a first transistor, a second transistor, a third transistor, and a storage capacitor on the base substrate, the storage capacitor comprises a first capacitor electrode, a second capacitor electrode and a third capacitor electrode, and the second capacitor electrode is electrically connected with the third capacitor electrode;

a first electrode of the second transistor is electrically connected to the first capacitor electrode of the storage capacitor and a gate electrode of the first transistor, a second electrode of the second transistor is configured to receive a data signal, a gate electrode of the second transistor is configured to receive a first control signal, and the second transistor is configured to write the data signal to the gate electrode of the first transistor and the storage capacitor in response to the first control signal, a first electrode of the first transistor is electrically connected to a second capacitor electrode of the storage capacitor and configured to be electrically connected to a light emitting element, a second electrode of the first transistor is configured to receive a first power voltage, and the first transistor is configured to control a current for driving the light emitting element under control of a voltage of the gate electrode of the first transistor, a first electrode of the third transistor is electrically connected with the first electrode of the first transistor and a second capacitor electrode of the storage capacitor, a second electrode of the third transistor is configured to be connected with a detection circuit, a gate electrode of the third transistor is configured to receive a second control signal, and the third transistor is configured to detect an electrical characteristic of the sub-pixel to which the third transistor belongs by the detection circuit in response to the second control signal;

the second capacitor electrode is on a side of the first capacitor electrode close to the base substrate, the third capacitor electrode is on a side of the first capacitor electrode away from the base substrate, and the first capacitor electrode is at least partially overlapped with the second capacitor electrode and the third capacitor electrode in a direction perpendicular to the base substrate;

the first capacitor electrode has a first capacitor electrode side and a second capacitor electrode side opposite to each other in the second direction, and the second capacitor electrode has a third capacitor electrode side and a fourth capacitor electrode side opposite to each other in the second direction;

an orthographic projection of the first capacitor electrode side on the base substrate and an orthographic projection of the second capacitor electrode side on the base substrate are between an orthographic projection of the third capacitor electrode side on the base substrate and an orthographic projection of the fourth capacitor electrode side on the base substrate;

the first electrode of the first transistor, the first electrode of the third transistor, and the third capacitor electrode are one same electrode pattern.

3. The display substrate according to claim 2, wherein the third capacitor electrode has a fifth capacitor electrode side and a sixth capacitor electrode side opposite to each other in the second direction, an orthographic projection of the fifth capacitor electrode side on the base substrate and an orthographic projection of the sixth capacitor electrode side on the base substrate are between the orthographic projection of the first capacitor electrode side on the base substrate and the orthographic projection of the second capacitor electrode side on the base substrate.

4. The display substrate according to claim 3, wherein the fifth capacitor electrode side and the first capacitor electrode side are located on a same side of the sub-pixel, and the sixth capacitor electrode side and the second capacitor electrode side are located in another same side of the sub-pixel;

in the first direction, the pitch W2 between the orthographic projection of the fifth capacitor electrode side on the base substrate and the projection of the first capacitor electrode side on the base substrate satisfies:

$$W2 \geq a2 + (b2-b3)/2,$$

wherein a2 is an alignment error of the third capacitor electrode to the first capacitor electrode in the second direction, b2 is a difference between a design value and an actual value of the first capacitor electrode in the second direction, and b3 is a difference between the design value and the actual value of the third capacitor electrode in the second direction.

5. The display substrate according to claim 2, wherein the first capacitor electrode side and the third capacitor electrode side are on a same side of the sub-pixel, and the second capacitor electrode side and the fourth capacitor electrode side are on another same side of the sub-pixel;

in the first direction, the pitch W1 between the orthographic projection of the first capacitor electrode side on the base substrate and the projection of the third capacitor electrode side on the base substrate satisfies:

$W1 \geq a1 + (b1-b2)/2$, wherein a1 is an alignment error of the first capacitor electrode to the second capacitor electrode in the second direction, b1 is a difference between a design value and an actual value of the second capacitor electrode in the second direction, and b2 is a difference between the design value and the actual value of the first capacitor electrode in the second direction.

6. The display substrate according to claim 2, wherein a center line of an orthographic projection of the first capacitor electrode on the base substrate in the first direction, a center line of an orthographic projection of the second capacitor electrode on the base substrate in the first direction, and a center line of an orthographic projection of the third capacitor electrode on the base substrate in the first direction coincide with one another.

7. The display substrate according to claim 2, wherein the first capacitor electrode, an active layer of the first transistor, an active layer of the second transistor, and an active layer of the third transistor are in a same layer;
the first capacitor electrode and the active layer of the second transistor are in an integral structure, and the first capacitor electrode, the active layer of the first transistor, and the active layer of the third transistor are insulated from one another.

8. The display substrate according to claim 2, wherein a first electrode of the third transistor is electrically connected to the second capacitor electrode through a first via hole, thereby electrically connecting the second capacitor electrode to the third capacitor electrode.

9. The display substrate according to claim 8, wherein the first electrode of the third transistor is further electrically connected to an active layer of the third transistor through a second via hole;
in the first direction, the first via hole and the second via hole are located on a same side of the first capacitor electrode.

10. The display substrate according to claim 8, wherein the first via hole is not overlapped with the first capacitor electrode in the direction perpendicular to the base substrate.

11. A display device comprising the display substrate according to claim 2 and the light emitting element.

12. A display substrate, comprising:
a base substrate, and
a plurality of sub-pixels on the base substrate,
wherein the plurality of sub-pixels are arranged in a sub-pixel array in a first direction and a second direction, the first direction intersecting with the second direction,
at least one of the plurality of sub-pixels comprises a first transistor, a second transistor, a third transistor, and a storage capacitor on the base substrate,
the storage capacitor comprises a first capacitor electrode, a second capacitor electrode and a third capacitor electrode, and the second capacitor electrode is electrically connected with the third capacitor electrode;
a first electrode of the second transistor is electrically connected to the first capacitor electrode of the storage capacitor and a gate electrode of the first transistor, a second electrode of the second transistor is configured to receive a data signal, a gate electrode of the second transistor is configured to receive a first control signal, and the second transistor is configured to write the data signal to the gate electrode of the first transistor and the storage capacitor in response to the first control signal,
a first electrode of the first transistor is electrically connected to a second capacitor electrode of the storage capacitor and configured to be electrically connected to a light emitting element, a second electrode of the first transistor is configured to receive a first power voltage, and the first transistor is configured to control a current for driving the light emitting element under control of a voltage of the gate electrode of the first transistor,
a first electrode of the third transistor is electrically connected with the first electrode of the first transistor and a second capacitor electrode of the storage capacitor, a second electrode of the third transistor is configured to be connected with a detection circuit, a gate electrode of the third transistor is configured to receive a second control signal, and the third transistor is configured to detect an electrical characteristic of the sub-pixel to which the third transistor belongs by the detection circuit in response to the second control signal;
the second capacitor electrode is on a side of the first capacitor electrode close to the base substrate, the third capacitor electrode is on a side of the first capacitor electrode away from the base substrate, and the first capacitor electrode is at least partially overlapped with the second capacitor electrode and the third capacitor electrode in a direction perpendicular to the base substrate;
the first capacitor electrode has a first capacitor electrode side and a second capacitor electrode side opposite to each other in the second direction, and the second capacitor electrode has a third capacitor electrode side and a fourth capacitor electrode side opposite to each other in the second direction;
an orthographic projection of the first capacitor electrode side on the base substrate and an orthographic projection of the second capacitor electrode side on the base substrate are between an orthographic projection of the third capacitor electrode side on the base substrate and an orthographic projection of the fourth capacitor electrode side on the base substrate;
wherein in the first direction, the first transistor and the second transistor are on a same side of the first capacitor electrode and on an opposite side of the first capacitor electrode to the third transistor.

13. The display substrate according to claim 12, wherein the display substrate further comprises an extension portion protruding from the gate electrode of the first transistor, and the extension portion is extended from the gate electrode of the first transistor in the second direction;
the extension portion is at least partially overlapped with the first electrode of the second transistor in the direction perpendicular to the base substrate and is electrically connected with the first electrode of the second transistor.

14. The display substrate according to claim 13, wherein an active layer of the second transistor comprises a first electrode contact region, a second electrode contact region, and a channel region between the first electrode contact region and the second electrode contact region,
the first electrode of the second transistor is electrically connected to the first electrode contact region, the extension portion, and the first capacitor electrode through a third via hole respectively.

15. The display substrate according to claim 14, wherein the third via hole is extended in the first direction and exposes a surface of the extension portion and at least portions of two side surfaces, which are opposite in the first direction, of the extension portion.

16. The display substrate according to claim 14, wherein a first electrode of the second transistor clads the two side surfaces of the extension portion through the first via hole.

17. The display substrate according to claim 12, wherein a gap exists between the second capacitor electrode and the first electrode of the second transistor in the first direction, the gap having a minimum size in a range of 0.5 μm to 6 μm in the first direction.

* * * * *